United States Patent [19]

Yanagisawa

[11] 4,411,608
[45] Oct. 25, 1983

[54] AUTOMATIC APPARATUS FOR TRANSFERRING ELECTRICAL CORDS WITH TERMINAL BLADES AND FOR THE TESTING THEREOF

[75] Inventor: Zensuke Yanagisawa, Tokyo, Japan

[73] Assignee: Kawasaki Electric Wire Co., Ltd., Kanagawa, Japan

[21] Appl. No.: 274,223

[22] Filed: Jun. 16, 1981

[51] Int. Cl.³ .......................................... H01R 43/00
[52] U.S. Cl. .................................. 425/123; 414/222; 29/564.4; 29/858; 324/51
[58] Field of Search .................. 414/222–226, 414/749–751, 753; 425/110, 112, 116, 121, 123, 129 R; 198/430, 472, 339; 200/162; 174/48, 135; 324/51, 158 F; 29/564.4, 564.1, 858

[56] References Cited

U.S. PATENT DOCUMENTS

| | | | |
|---|---|---|---|
| 3,444,618 | 5/1969 | Sorlie | 29/858 |
| 3,617,876 | 11/1971 | Robinson | 324/51 |
| 3,668,779 | 6/1972 | Turner | 29/858 |
| 3,999,289 | 12/1976 | Büttner et al. | 29/858 |
| 4,110,880 | 9/1978 | Peppler et al. | 324/51 X |
| 4,229,691 | 10/1980 | Loesch | 324/51 |

FOREIGN PATENT DOCUMENTS 56-5033  2/1981  Japan .

Primary Examiner—Robert J. Spar
Assistant Examiner—Terrance L. Siemens
Attorney, Agent, or Firm—Armstrong, Nikaido, Marmelstein & Kubovcik

[57] ABSTRACT

An apparatus is provided for performing an operation on a plurality of electrical cords with a pair of terminal blades attached to each cord. The apparatus comprises a plurality of carriers for receiving a plurality of electrical cords with a pair of terminal blades attached to each cord. Each of the carriers comprises a frame member having first and second sides opposed to each other. The first side has a plurality of pairs of recesses therein, each of the pairs of recesses receiving a pair of the terminal blades and securing members secure the terminal blades in the recesses. The second side has a plurality of cord inserting grooves, each of the grooves receiving one of the cords therein and a cord chuck retains the cord in the groove. The cord chuck is automatically operated. First, second, third and fourth side conveyors transport the carrier to various positions wherein manufacturing operations are performed at each of these positions. The first, second, third and fourth side conveyors are each driven independently and are positioned with respect to one another to form a rectangle.

12 Claims, 50 Drawing Figures

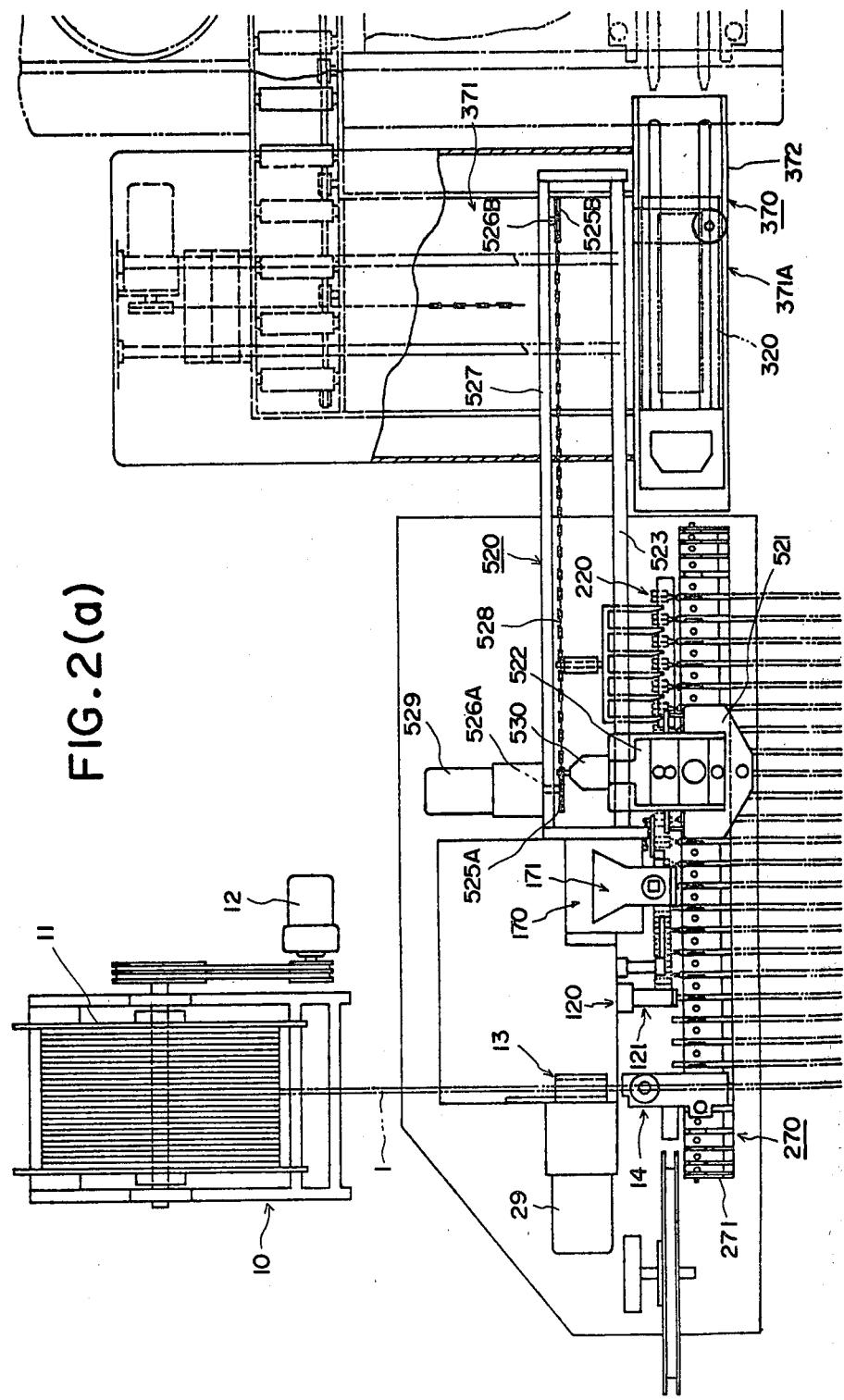

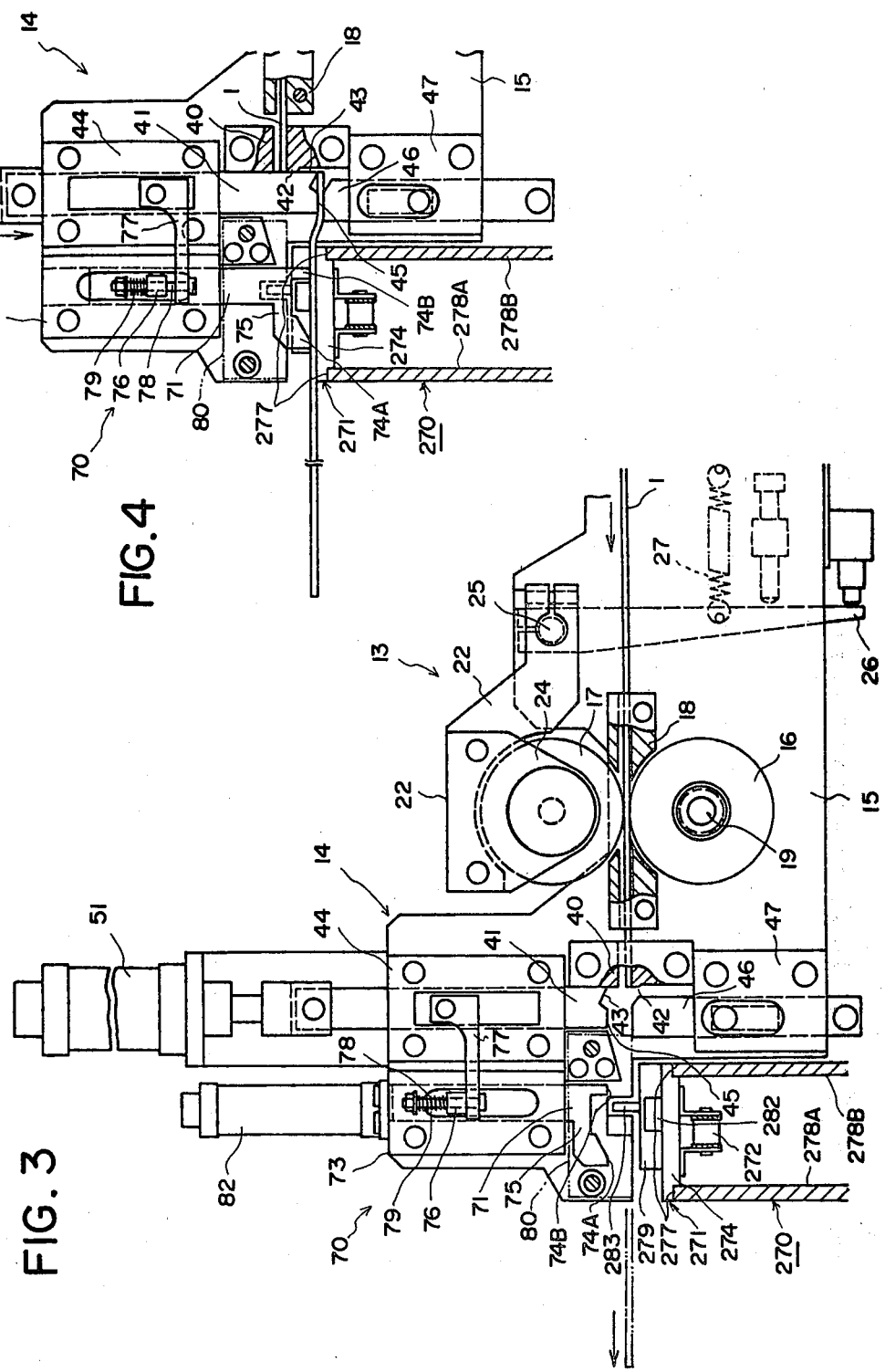

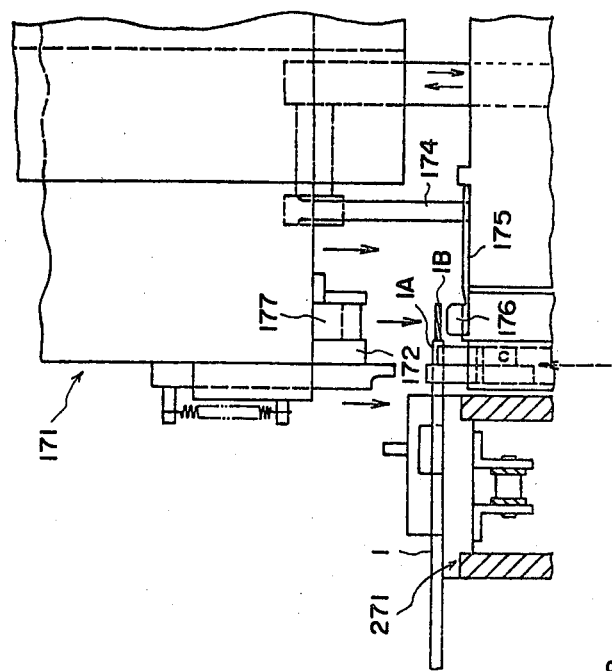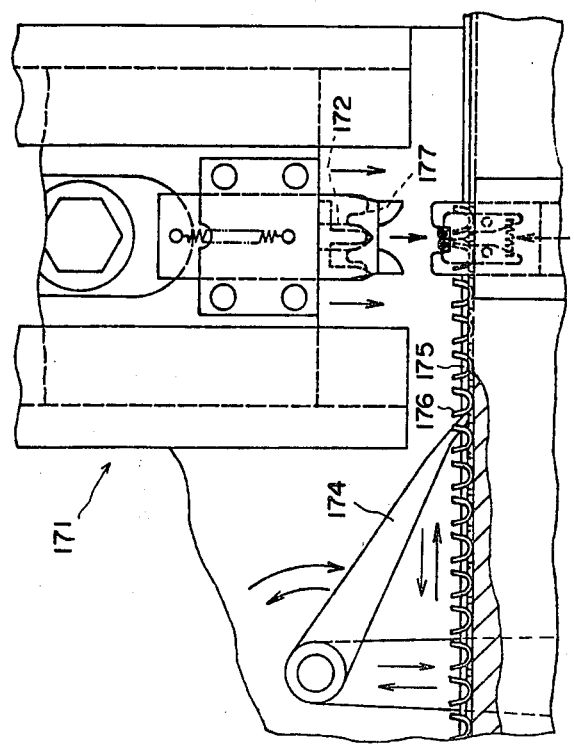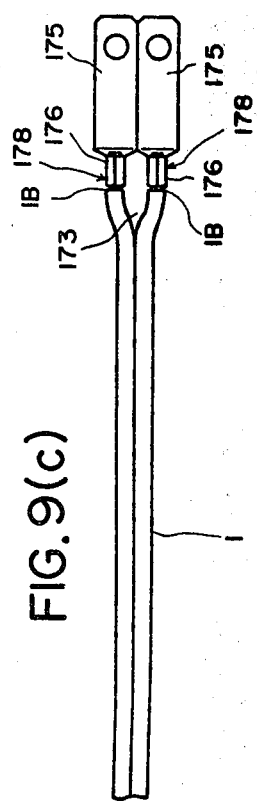

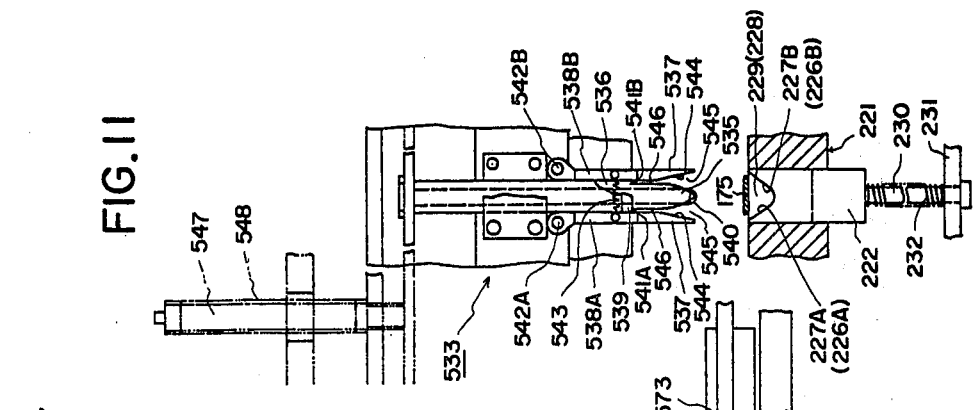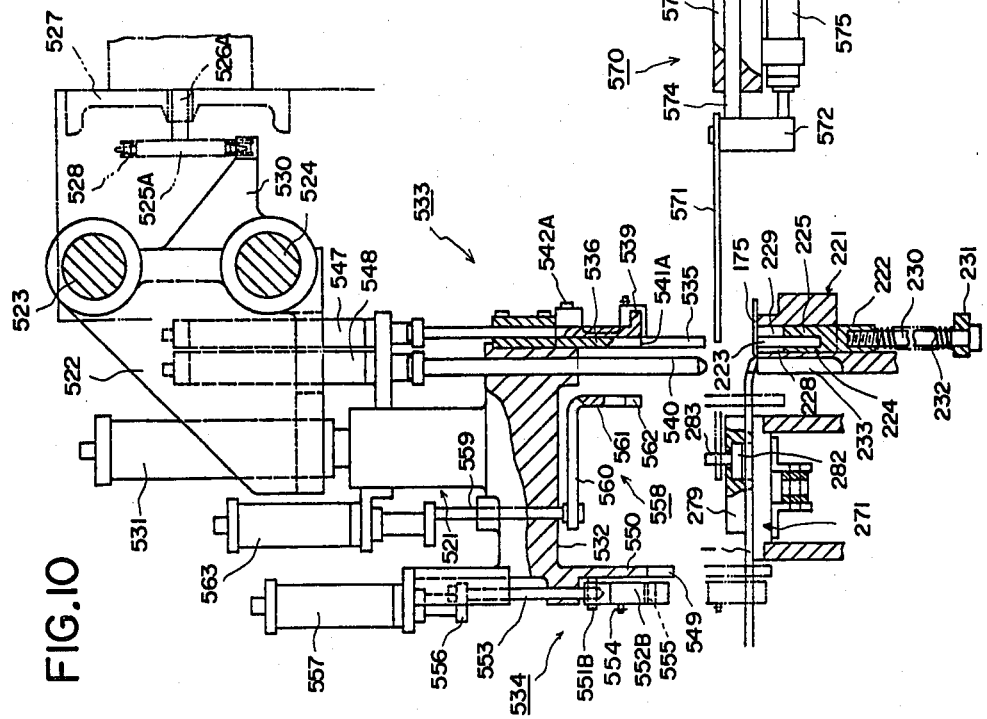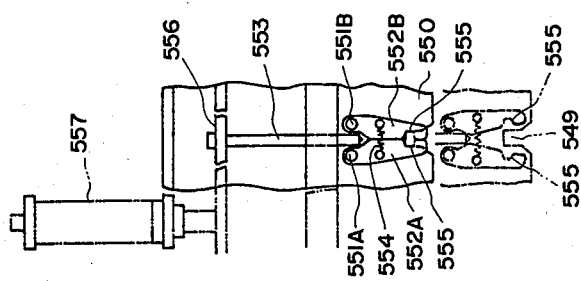

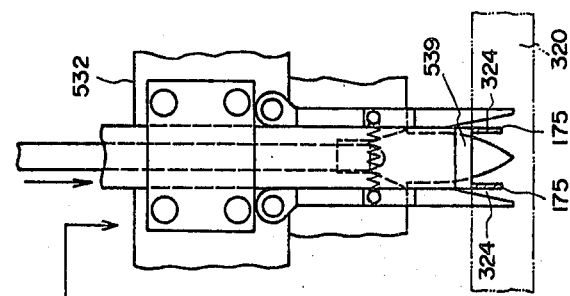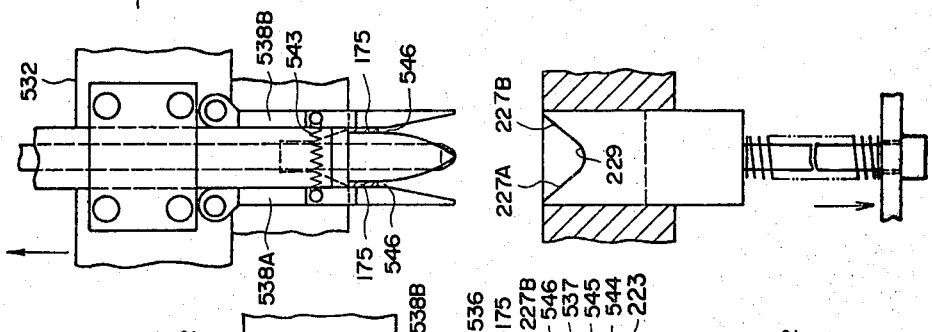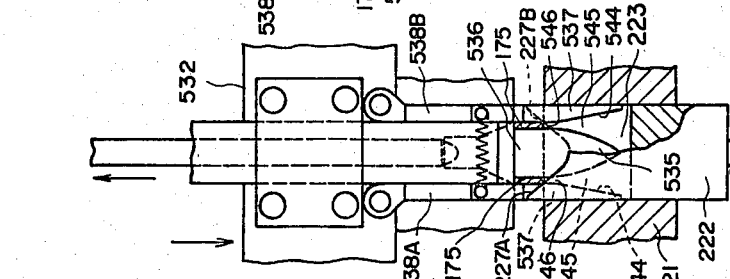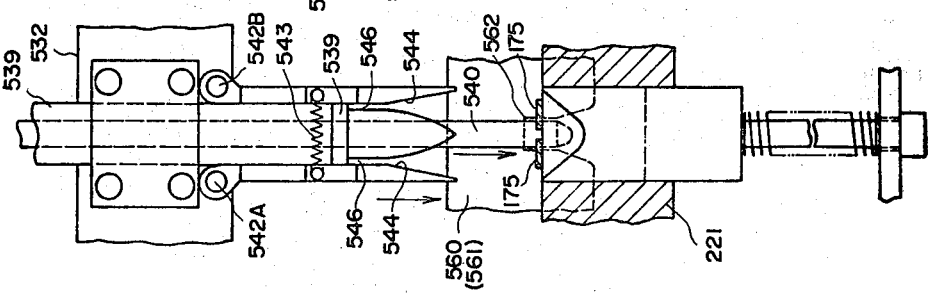

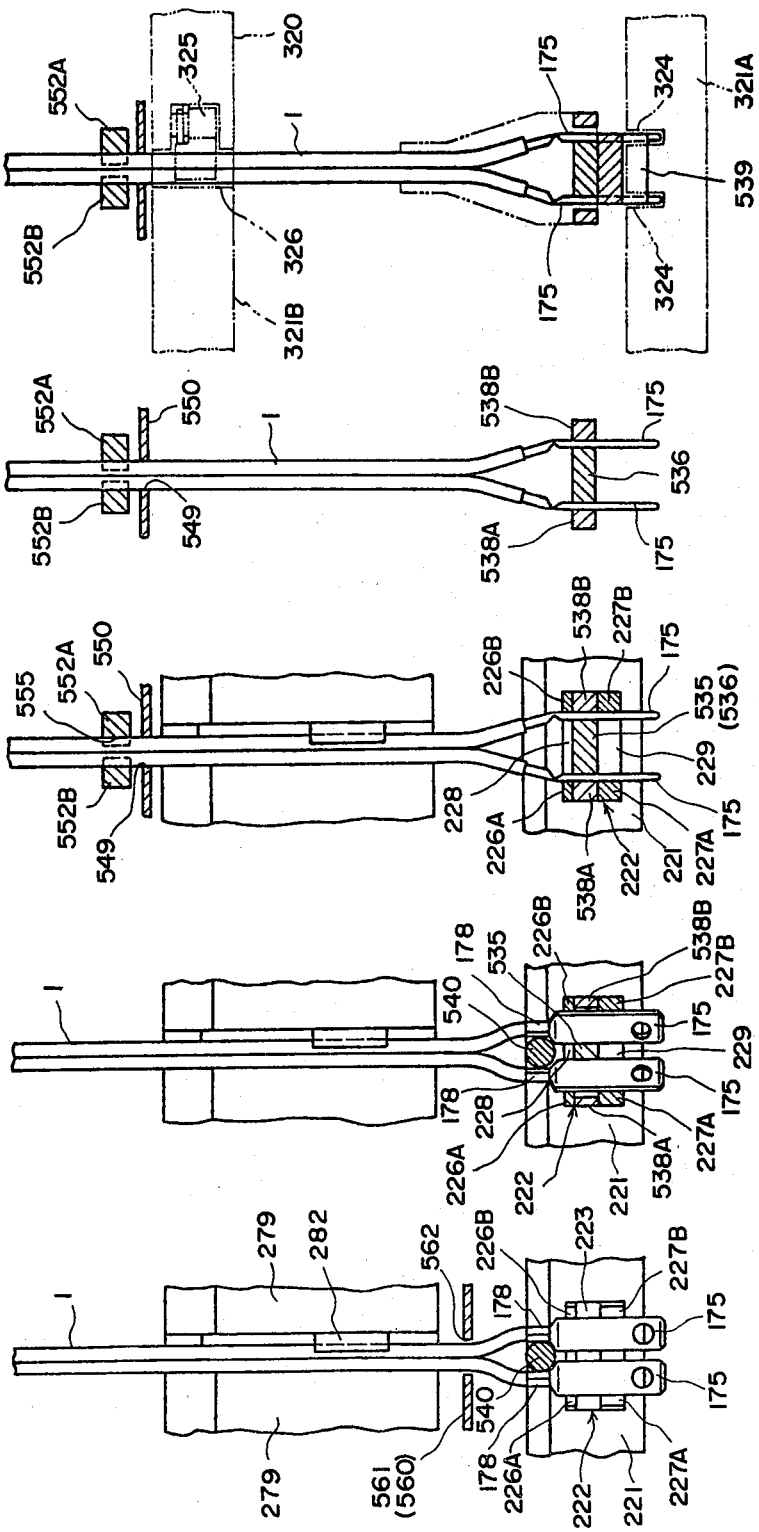

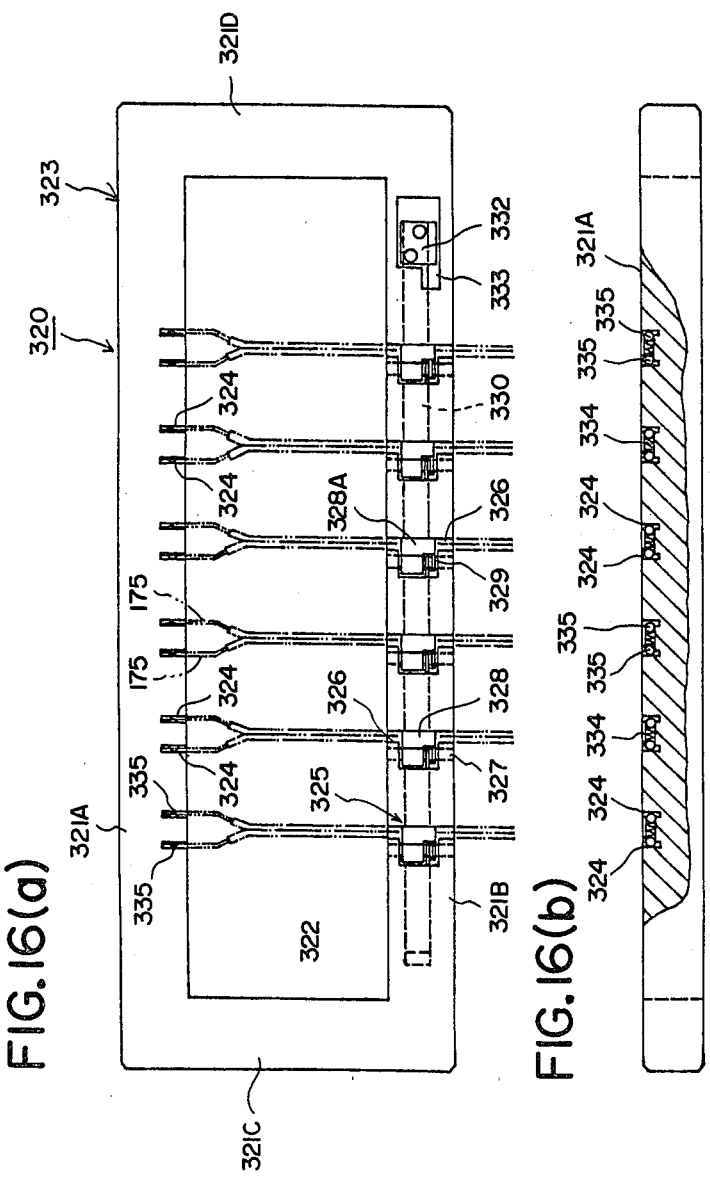
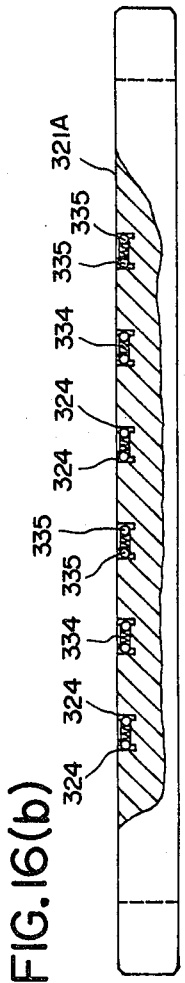
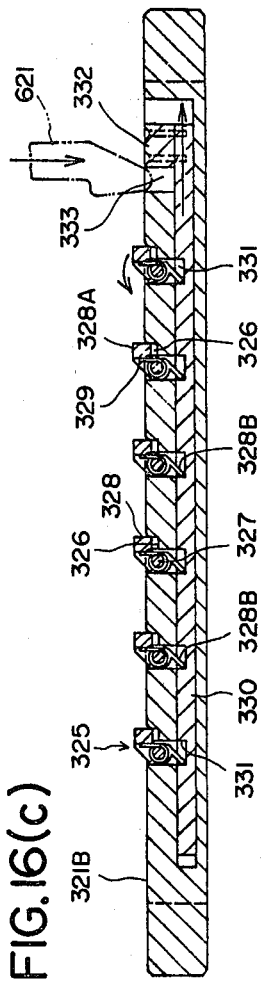
FIG.16(a)
FIG.16(b)
FIG.16(c)

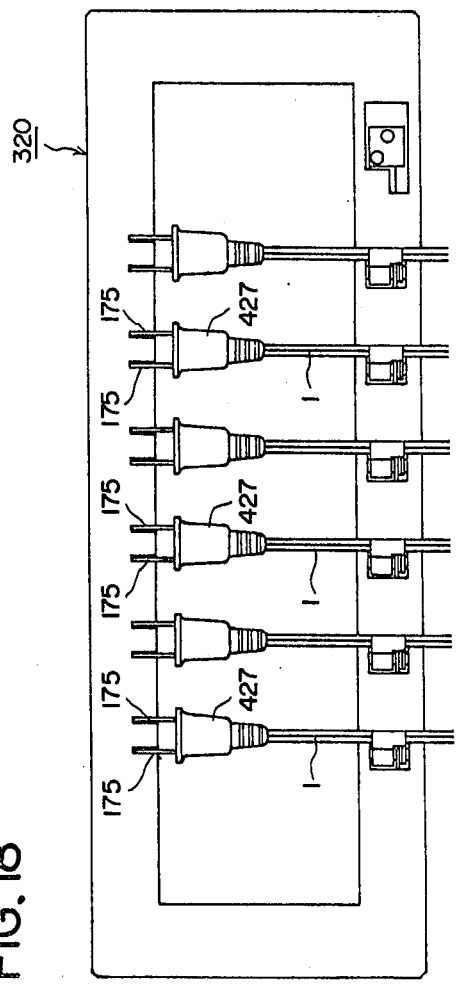
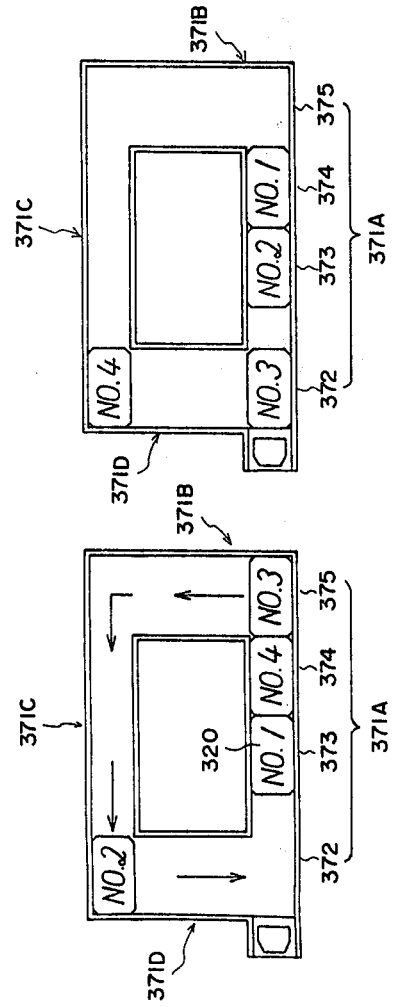

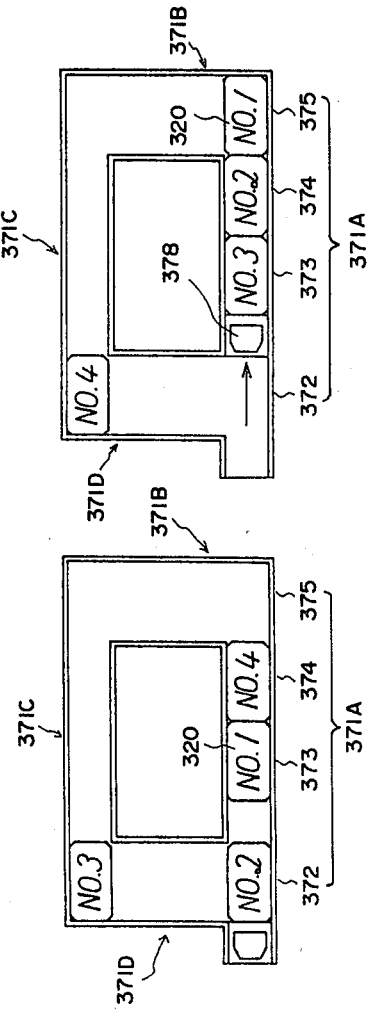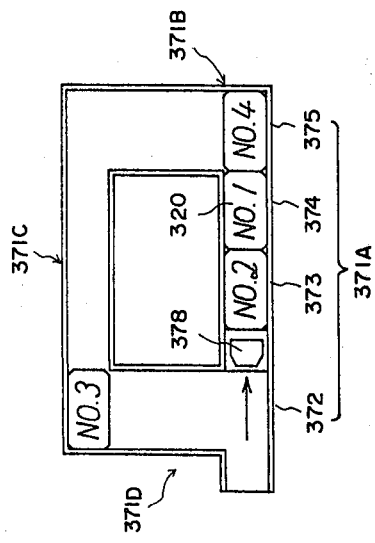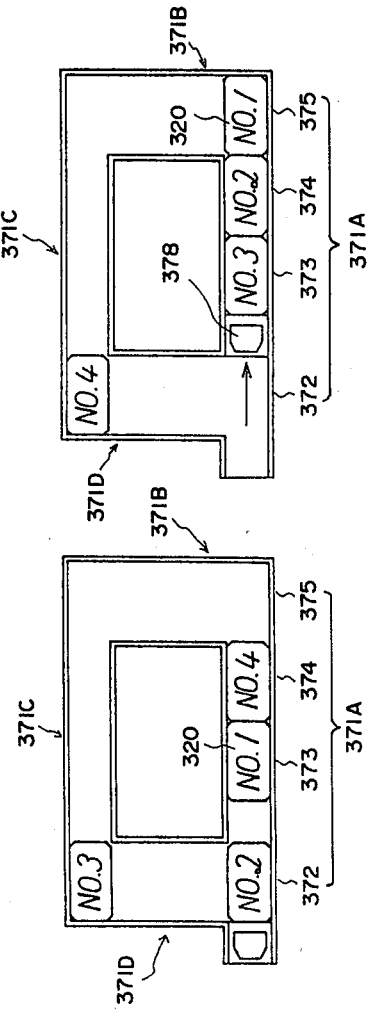

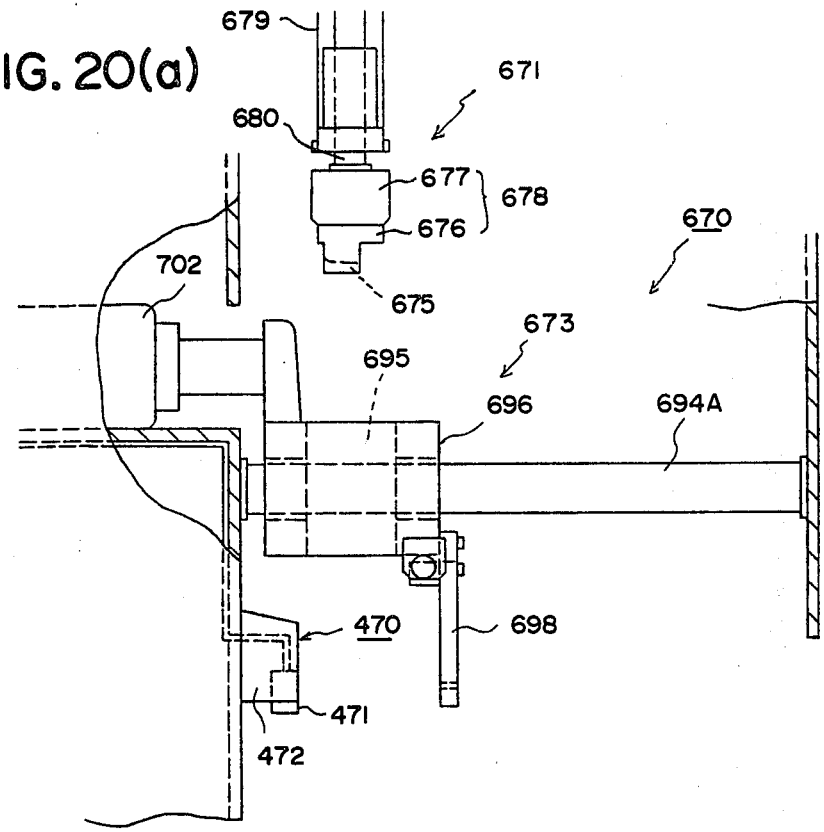
FIG. 20(a)
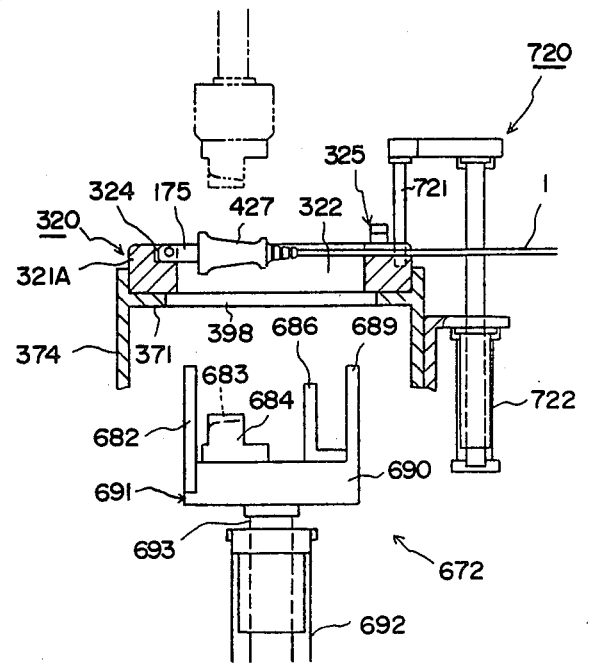

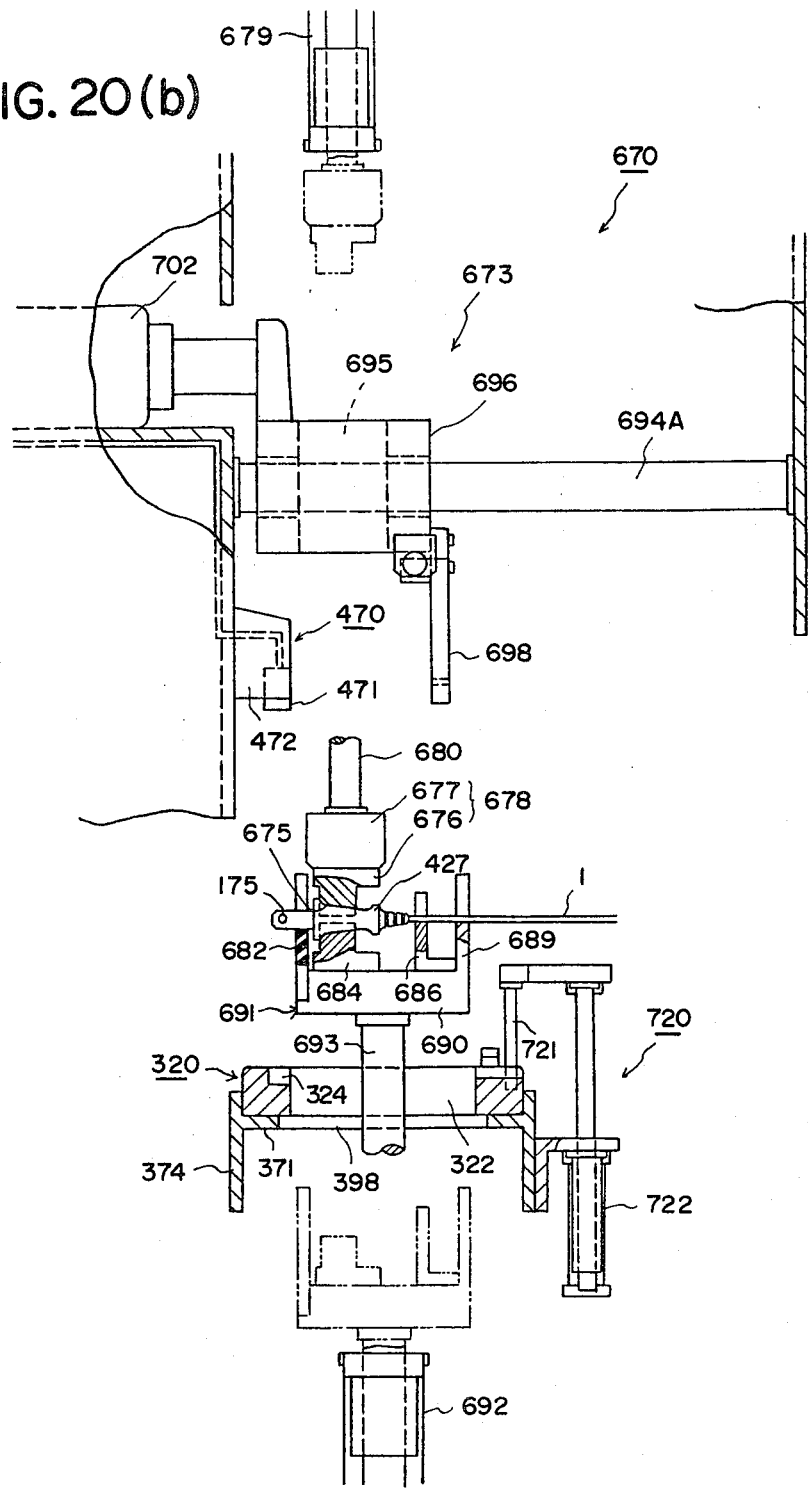

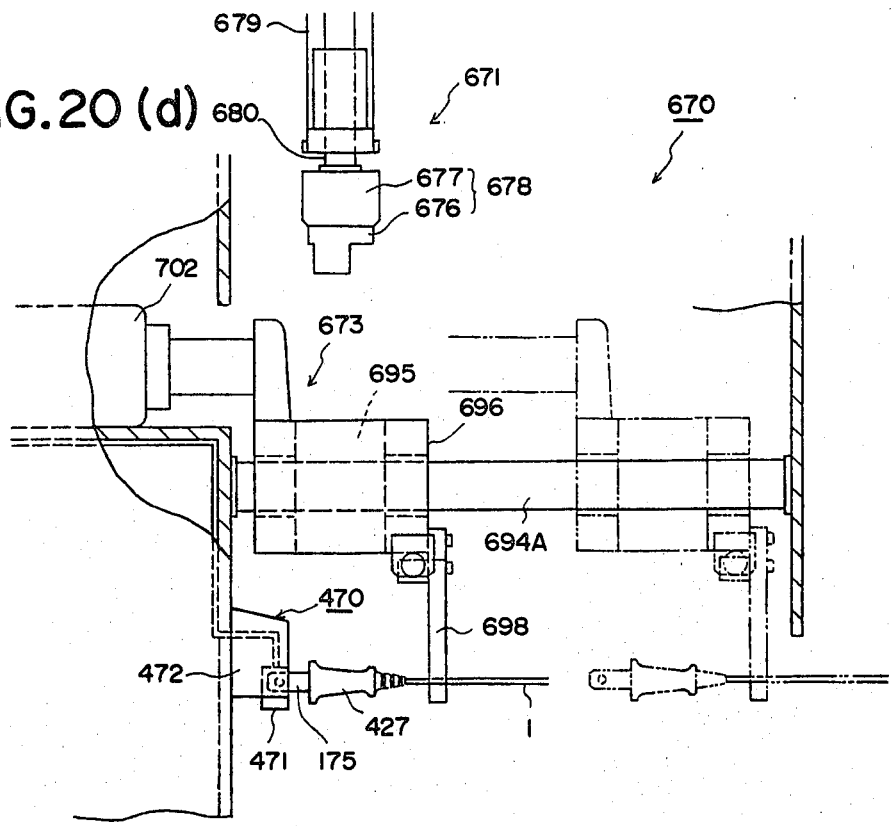
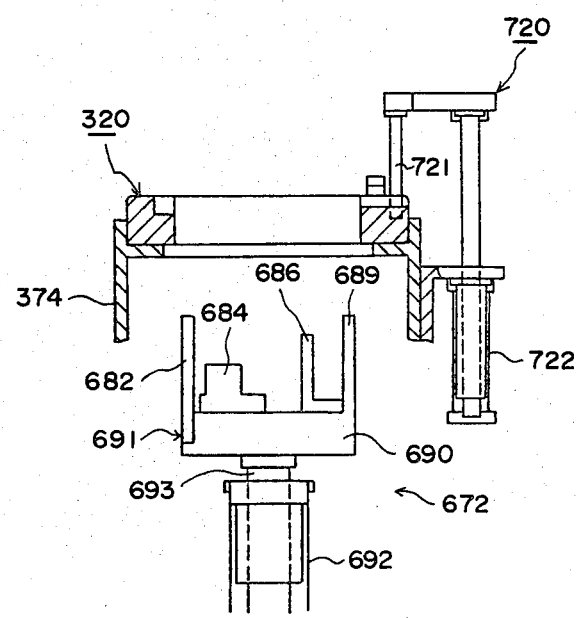
FIG. 20 (d)

FIG. 21(a)
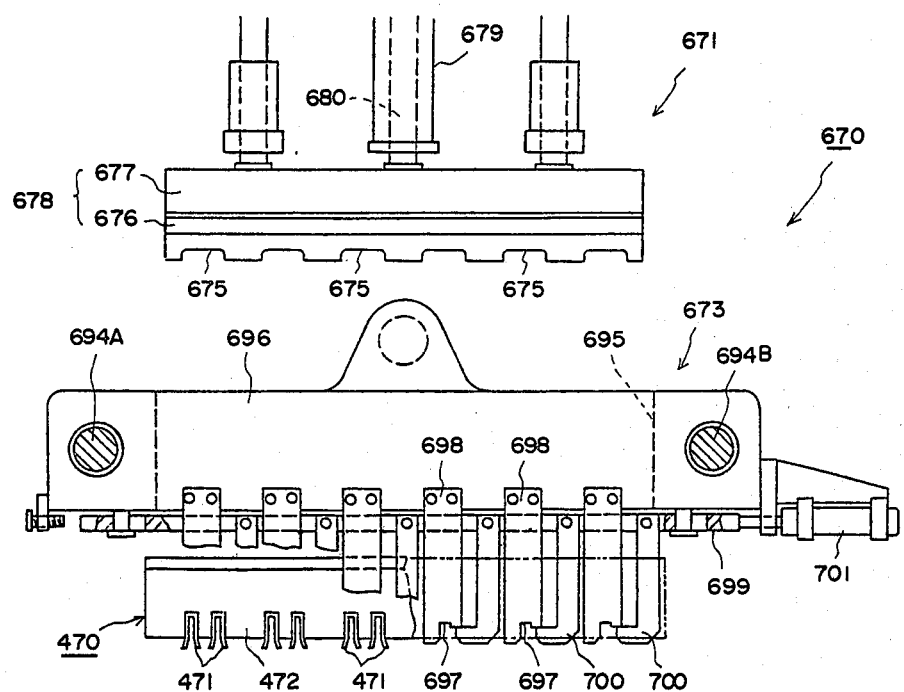
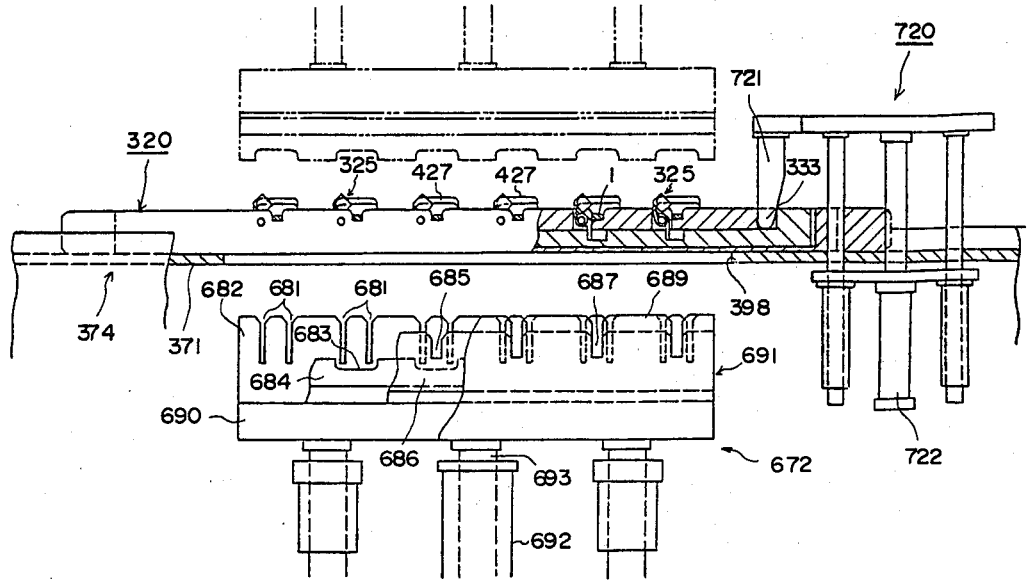

FIG. 21(d)
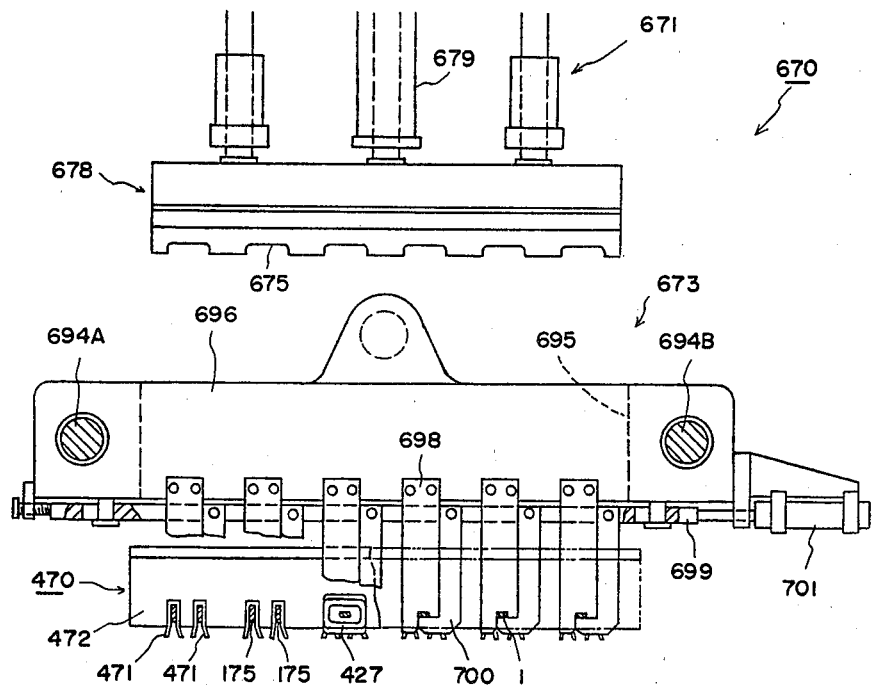
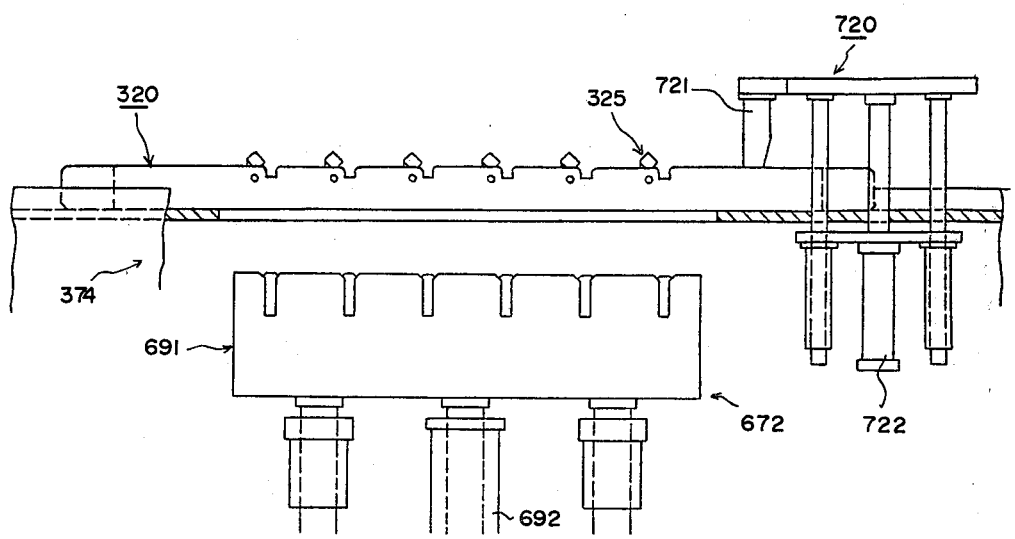

AUTOMATIC APPARATUS FOR TRANSFERRING ELECTRICAL CORDS WITH TERMINAL BLADES AND FOR THE TESTING THEREOF

BACKGROUND OF THE INVENTION

1. Field of the Invention

This invention in general relates to a fully-automatic system or apparatus for producing a cord length with a plug. More particularly, the present invention is concerned with an improvement in apparatus for producing a cord length with a plug whereby the production of a cord length with a plug can be fully-automatically carried out. For producing a cord length with a plug, there are needed steps of measuring, cutting and stripping a sheathed pair of parallel electric wires (a cord); applying an electric terminal element or blade to the stripped end of each of the wires; forming, by injection molding, a casing for the connecting parts between the stripped ends of the wires and the terminal blades; and inspecting the electric performance of the thus-obtained cord length with a plug. The improvement of the present invention enables the above-mentioned steps to be carried out fully-automatically.

2. Description of the Prior Art

Our investigation shows that there has not heretofore been proposed any prior art automatic apparatus in the United States, Japan or in any other countries that, during one operating cycle thereof, can automatically perform all the operations needed for obtaining a cord length with a plug, from the feeding of a sheathed pair of parallel electric wires to the inspection of the electric performance of the obtained cord length with a plug.

In a technical journal, "Journal of Labor-Saving and Automation" at pages 68–72, published November, 1979 (Vol. 10, No. 11: No. 120), by a publishing company, Ohm Inc., Japan, there is disclosed an automatic apparatus which, during one operating cycle thereof, can measuring the length of a sheathed pair of parallel electric wires, sever the measured electric wires, strip the insulation from the end of each wire, apply terminal blades to the ends of the wires and form, by injection molding, a casing for the connecting parts of the wires and the terminal blades. From a viewpoint of automation, this apparatus may be referred to as one of the pioneer apparatuses in the field. This apparatus, however, has a disadvantage in that the rotation of a terminal blade secured to each of the paired electric wires from its original horizontal position to its vertical position requires very complicated operations. Such rotation of a terminal blade is necessitated prior to the injection molding of a plug casing. More specifically, in the apparatus, the terminal blade is rotated to its vertical position as follows: When a sheathed pair of parallel electric wires having terminal blades applied thereto is laterally conveyed by means of a conveyor assembly to a predetermined location with respect to a terminal blade-rotating assembly, a gripping means, which is a constituent component of said terminal blade-rotating assembly, is advanced toward the terminal blades from the front direction thereof. This gripping means includes a pair of cylindrical legs each having a deep recess. After the pair of terminal blades have been inserted into the deep recesses of the pair of the cylindrical legs respectively, the pair of the cylindrical legs are rotated 90° inwardly with respect to each other so that each of the terminal blades is adjusted to a vertical position and then the gripping means is moved upward. When the gripping means has been moved upward through a predetermined distance, the gripping means is then advanced laterally, namely in a direction parallel to the conveyor chain until the gripping means reaches a position where the terminal blades are released from the recesses provided in the pair of the cylindrical legs. The terminal blades are released from each of the recesses by means of pushing pins which push the terminal blades to disengage them from the recesses. The terminal blades thus released are placed on the final stage section of said conveyor assembly with a predetermined spacing between them, assuring that each of the terminal blades is in the vertical position. The above-mentioned complicated series of mechanical operations is repeated every time when a cord length with a pair of terminal blades is transferred to be unlocked onto the final stage section of the conveyor assembly, thus rendering this particular stage further complicated. In other words, the terminal blade-rotating assembly includes only one pair of cylindrical legs, each having a deep recess, adapted to pick up the terminal blades secured to the ends of a sheathed pair of electric wires so the aforementioned cycle of motion of the gripping means including said pair of cylindrical legs, is repeated a predetermined number (for example, six) of times before a predetermined number (six) of sheathed pairs of blade-terminated electric wires are collected onto the final stage section of the conveyor assembly (six pairs of blade-terminated electric wires are treated as a group or unit in the next stage for the injection molding of a plug casing), leading to consumption of much time and lowering of the production efficiency.

Another disadvantage of this prior art apparatus is that the mold of an injection molding machine for forming the plug casing is set back from the conveyor assembly. A predetermined number (six) of cord lengths, each having a pair of terminal blades are transferred to the mold of the injection molding machine after being collected on the final stage section of the conveyor assembly, maintaining each terminal blade in the vertical position. It should be noted here that, in this prior art apparatus, a cord length is laterally conveyed by means of a conveyor assembly from the measuring and cutting machine so that the cord length is first stripped; second, terminated with a pair of terminal blades; and third, picked up, carried and positioned on the final stage section of the conveyor assembly with the terminal blades being arranged in a row with a predetermined spacing between them and adjusted to their vertical position. Next, a predetermined number (six) of cord lengths with terminal blades are transferred to the mold of the injection molding machine by means of an inserting head. At this time, however, the direction of movement of a predetermined number (six) of cord lengths, each having a pair of terminal blades is all of a sudden changed and the cords are transferred in a direction perpendicular to the axis of the conveyor assembly, because the mold of the injection molding machine is disposed behind the conveyor assembly. This may unfavorably give rise to a phenomenon in which a predetermined number (six) of cord lengths which have been transferred to the mold of said injection molding machine will still have their tail ends located on the final stage section of the conveyor assembly. These tail ends can then overlap and intermingle with the cord lengths which are then being collected on the final stage section.

It should also be noted that this prior art apparatus does not include inspection equipment for inspecting the electric performance of each of the finally obtained cords with plugs and sorting good products from rejects.

Accordingly, it properly follows that this apparatus does not provide for full automatic production of cords with plugs.

In Japanese Patent Application Publication No. 56-5033 published on Feb. 3, 1981, there is also disclosed an automatic apparatus for producing cord lengths with plugs which includes a device for transferring a set of cord lengths to the mold of the molding machine for forming a plug casing after each of the terminal blades secured to the set of cord lengths is adjusted to a vertical position. Such device is in the form of a rectangular framework cord length carrier. This rectangular framework cord length carrier includes a plurality of cord length clamps, each adapted to releasably grip a terminal blade so that a set of cord lengths can be mounted on the cord length carrier with their terminal blades adjusted to their vertical position and arranged in a row with a predetermined spacing between them. The rectangular framework cord length carrier is moved by means of a conveyor means along an endless guide track so as to convey a set of blade-terminated cord lengths to the stage for injection molding of a plug casing. The cord length carrier also serves as a plug casing-forming auxiliary molding flask when the set of blade-terminated cord lengths carried thereby are subjected to injection molding for forming a plug casing. Illustratively stated, the cycle of motion of the rectangular framework cord length carrier according to this conventional apparatus is as follows: A set of cord lengths, each having a pair of terminal blades, are first placed on the cord length carrier stationed at its starting position so that their terminal blades are arranged in a row with a predetermined spacing between them and are in their vertical position. When a set of blade-terminated cord lengths have been placed on the cord length carrier in the above-mentioned manner, the cord length carrier is moved along the endless guide track until it gets to the mold of the injection molding machine for forming a plug casing. After completion of the molding of a casing for the connecting parts between each of the cord lengths and its terminal blades, the cord length carrier is then moved via a molding casing cooling equipment to a position where each cord length with a plug is taken off the cord length carrier. At this final stage section, means are provided for taking the final products off the cord length carrier at a time. Such means is in the form of a gatherer, including a set of pairs of jaws adapted for gripping. Thereafter, the emptied cord length carrier is further moved along the endless guide track so that the cord length carrier is returned to its starting position and reset for the next cycle of motion. Thus, the prior art automatic apparatus allows a plurality of blade-terminated cord lengths to be transferred at a time to the stage for injection molding of a plug casing and, further, to the final stage section where each of the final products (cord lengths with plugs) is taken off the cord length carrier by means of a gatherer, including a set of pairs of jaws adapted for gripping.

In Japanese Patent Application Publication No. 56-5033, however, there is no specific description of how a set of blade-terminated cord lengths are transferred from the preceding stage section and placed on the cord length carrier stationed at its starting position. It appears that a set of blade-terminated cord lengths are manually transferred and placed on the cord length carrier while rotating their terminal blades to their vertical position and arranging them in a row with a predetermined spacing therebetween.

As described, the cord length carrier includes a set of cord length clamps provided thereon and adapted to releasably grip a set of cord lengths, each having a pair of terminal blades. A set of blade-terminated cord lengths are firmly held on and released from the cord length carrier by opening and closing the set of cord length clamps on the cord length carrier. It should be noted here that the cord length clamps are biased to an open position not automatically, but manually in this prior art apparatus, i.e., an operator presses down a pedal so as to open the cord length clamps. Thus, in this prior art apparatus, there are, in fact, two operations accomplished manually by an operator, i.e., the transferring of a set of blade-terminated cord lengths to the cord length carrier stationed at its starting position and the opening of the cord clamps on the cord length carrier. The opening of the cord length clamps is necessarily conducted prior to said transferring of a set of blade-terminated cord lengths to the cord length carrier and prior to the taking of the final products (cord lengths with plugs) off the cord length carrier at the final stage of the operating cycle of the apparatus. In view of the above, this prior art apparatus will be most properly referred to as a "semi-automatic apparatus" for obtaining a cord length with a plug.

Another disadvantage of this apparatus is that, as is the case with the apparatus described in "Journal of Labor-Saving and Automation", the plug casing injection molding machine configuration of the apparatus is such that it is located at the back of the apparatus. More specifically and referring to the cycle of motion of the aforementioned rectangular framework cord length carrier, the cord length carrier, after a set of blade-terminated cord lengths have been placed thereon at its starting position located at one end of the first side of the guide track of a six-sided shape (which would be formed by cutting out the right-hand lower rectangular corner portion from a rectangular shape), is moved along the first side of the guide track to get to the "preliminary position" for the subsequent plug casing injection molding located at the other end of said first side. The direction of movement of the cord length carrier is subsequently changed 90° inwardly and the cord length carrier is moved along the second side extending from the "preliminary position" to get to the mold of the plug casing injection molding machine disposed behind the "preliminary position". With such a plug casing injection molding machine configuration which is similar to that of the apparatus described in "Journal of Labor-Saving and Automation", this apparatus also suffers from a disadvantage that a set of blade-terminated cord lengths having been transferred to the mold of the injection molding machine have their tail ends still remaining on the "preliminary position" for the subsequent plug casing injection molding. In order to prevent the tail ends from overlapping and intermingling with the next set of blade-terminated cord lengths, the cord length carrier with the next set of blade-terminated cord lengths placed thereon is retarded in its advancement to the "preliminary position" until the plug casing injection molding operation for the preceding set of blade-terminated cord lengths is finished and their tail ends are completely removed from said "preliminary position," resulting in the entire advancing flow of cord length carriers being slowed up. Such slowed up conveying operation will necessarily lead to a large decrease in production efficiency.

It should also be noted that, as in the case of the apparatus described in "Journal of Labor-Saving and Automation", this apparatus does not either include an inspection equipment for inspecting the electric performance of each of the final products. It is concluded from the above that the apparatus described in Japanese Patent Application Publication No. 56-5033 is incapable of automatically performing, during one operating cycle thereof, all the operations needed for obtaining a cord length with a plug, i.e., from the measuring, cutting and stripping of a sheathed pair of parallel electric wires to the inspecting of a finally-obtained product with respect to its electric performance. This apparatus is rather a semi-automatic apparatus for obtaining a cord length with a plug which is capable of automatically performing only part of the operations in the entire cord length with a plug producing process.

SUMMARY OF THE INVENTION

Accordingly, it is a principal object of the present invention to provide a fully-automatic system or apparatus for producing a cord length with a plug which is capable of automatically, efficiently and successively performing, during one operating cycle thereof, all the operations needed for producing a cord length with a plug, from the feeding of a sheathed pair of parallel electric wires (a cord) to the inspection of the electric performance of the finally-obtained cord length with a plug.

Accordingly, the present invention provides a fully-automatic apparatus for measuring, cutting and stripping a sheathed pair of parallel electric wires; applying an electric terminal element or blade to the stripped end of each of the wires; forming, by injection molding, a casing for the connecting parts between the stripped ends of the wires and the terminal blades; and inspecting the electric performance of the above-obtained cord length with a plug comprising:

(1) a conveyor assembly which is used to laterally convey a measured and cut cord length to first, second and third stage sections of the conveyor assembly, said first stage section being a position where the insulation is stripped from the end of each wire of said cord, said second stage section being a position where the application of a pair of terminal blades to the stripped ends of said wires is effected, and said third stage section being a preliminary position for plug housing injection molding where a plurality of cord lengths, each terminated with a pair of terminal blades, are arranged in a row so that they can be transferred as a group or unit;

(2) a cord carrier which is used to transfer a predetermined number of terminated cord lengths to the mold of a plug housing injection molding machine and which also serves, at the time of injection molding, as a plug casing-forming auxiliary molding flask, said predetermined number of terminated cord lengths being, prior to their transfer to the mold of said plug housing injection molding machine, mounted on the cord length carrier with their terminal blades rotated to a vertical position while remaining in their row arrangement;

(3) a cord length carrier circulating assembly which is used to carry the cord length carrier loaded with a predetermined number of terminated cord lengths, along an endless guide track which is rectangular in shape, said cord length carrier circulating machine being adapted to carry said cord length carrier in a step-by-step manner so that the cord length carrier is stopped, respectively, at positions 1, 2, 3 and 4, all located on one of the longer side members of said rectangular guide track; position 1 located at one end portion, positions 2 and 3 at intermediate portions, and position 4 at the other end portion of the longer side member;

(4) a gripping means adapted to pick up a predetermined number of terminated cord lengths at one time from said third stage section of the operating cycle of the conveyor assembly and adapted to unload them on the cord length carrier stationed at position 1 of said rectangular guide track in such a way that their terminal blades are arranged in a row and in a vertical position;

(5) a cord length carrying block opening equipment by means of which a predetermined number of pairs of cord length carrying blocks provided on the conveyor assembly and adapted to grip cord lengths for movement to a cord length stripping machine, a terminal blade applicator, etc., are, at a time, biased to an open position, thereby enabling said gripping means to pick up a predetermined number of terminated cord lengths at one time from said third stage section of the conveyor assembly;

(6) a cord chuck opening and closing equipment by means of which a predetermined number of cord chucks provided on the cord length carrier and adapted to hold a predetermined number of blade-terminated cord lengths in place on the cord length carrier are biased to open and closed positions, said cord chuck opening and closing equipment biasing the predetermined number of cord chucks to an open position when a predetermined number of blade-terminated cord lengths are released from the gripping means onto the cord length carrier stationed at position 1 and biasing to a closed position after the predetermined number of blade-terminated cord lengths have been seated in a low arrangement on the cord length carrier with their terminal blades in a vertical position;

(7) a plug housing injection molding machine which is located at position 2 of the endless rectangular guide track;

(8) inspection equipment which is located at the position 3 of the endless rectangular guide track and which is used to inspect the electric performance of each of the finally obtained cord lengths with plugs;

(9) an automatic taking-out and shifting device which is used to pick up a predetermined number of cord lengths with molded plugs at a time, from the cord length carrier advanced to and stationed at position 3 and to position them in the inspection equipment located at position 3, the automatic taking-out and shifting device being further used to take the predetermined number of cords with molded plugs out of the inspection equipment at one time; and

(10) another cord chuck opening and closing equipment located at position 3 by means of which the predetermined number of cord chucks provided on the cord carrier are biased to an open position, thereby enabling the automatic taking-out and shifting device to pick up the predetermined number of cord lengths with molded plugs at one time from the cord length carrier which has been moved to, and stationed at, position 3.

The conveyor assembly further includes a pivotally movable conveyor chain and a number of cord length carrying blocks mounted on the conveyor chain. A cord length carrying block is adapted to cooperate with a neighboring cord length carrying block to hold a measured and cut cord length therebetween, thereby to enable the measured and cut cord length to be laterally conveyed to the first, second and third stage sections of the conveyor assembly.

The gripping means includes a cord length holding device which is capable of picking up and releasing a predetermined number of cord lengths, each terminated with a pair of terminal blades at one time, and said cord length holding device includes a terminal blade rotating mechanism.

This terminal blade rotating mechanism is adapted to rotate to a vertical position the terminal blades of each of a predetermined number of blade-terminated cords at the moment when the predetermined number of blade-terminated cords are picked up by means of the cord length holding device from the third stage section of the conveyor assembly, facilitating the unloading of the predetermined number of blade-terminated cords in a row arrangement onto the cord length carrier stationed at position 1 with their terminal blades being in a vertical position.

The cord length carrier, which also serves as a plug housing-forming auxiliary molding flask is composed of four members assembled into a rectangular framework and includes, in one of the longer side members of the rectangular framework, a predetermined number of pairs of grooves arranged in a row, the rwo extending in the longitudinal direction of said side member. On the opposite longer side member of the rectangular framework, there are provided cord chucks also arranged in a row extending in the longitudinal direction of said longer side member. Each pair of grooves is adapted to cooperate with a cord chuck in alignment with the paired grooves to hold a blade-terminated cord in place on the cord length carrier, the grooves receiving the terminal blades and the cord chuck gripping the cord. The cord length carrier further includes a sliding rod which is adapted to slide, and thereby to bias each of said cord chucks simultaneously, at one time, to open and closed positions. The sliding movement of the sliding rod to open and close the cord chucks is effected by means of a pushing rod, which is a component of the cord chuck opening and closing equipment disposed at positions 1 and 3 of the endless rectangular guide track for the cord length carrier. With such a cord length carrier, a predetermined number of blade-terminated cords can be fully-automatically held in a row arrangement on the cord length carrier stationed at position 1 with their terminal blades being in a vertical position when they are transferred by means of the gripping means from the third stage section of the conveyor assembly to said cord length carrier stationed at position 1. In addition, such a cord length carrier enables a predetermined number of cord lengths with molded plugs to be also fully-automatically picked up by means of the automatic picking-up and transferring device from the cord length carrier advanced to and stationed at position 3, and positioned in the inspection equipment located at position 3.

The cord length carrier circulating assembly includes an endless guide track which is, as a whole, rectangular in shape and four cord length carriers, each of which is moved in an intermittent or step-by-step manner along said rectangular guide track so as to stop, respectively, at positions 1, 2, 3 and 4. The positions 1, 2, 3 and 4 are located respectively at one end portion, two intermediate portions, and the other end portion of one of the longer side members of said endless rectangular guide track. Each cord length carrier starts from position 1 and is moved along the guide track until it gets back to position 1, stopping respectively at position 2, position 3 and position 4, all located on one side member of the rectangular guide track. Disposed above and below the position 2 are, respectively, a cope flask and a drag, both of which are components of the plug housing injection molding machine and adapted to cooperate with each other to mold a predetermined number of plug housings for a predetermined number of blade-terminated cord lengths when injection molding is effected. Disposed above positions 3 are a predetermined number of pairs of electricity-conducting notches which are a part of the inspection equipment for inspecting the electric performance of a final product. The protruding portions of the terminal blades of a plug of each cord with a plug are interfitted into a pair of said electricity-conducting notches so that the finally-obtained cord, with a plug, can be inspected with respect to its electric performance. Having such a constitution, the present apparatus is capable of fully-automatically and efficiently performing a series of operations, including arranging a predetermined number of blade-terminated cord lengths in a row on the cord length carrier stationed at position 2; forming, by injection molding, a casing for the connecting parts between the stripped ends of a sheathed pair of parallel electric wires and the terminal blades; and inspecting the electric performance of the finally-obtained cord with a molded plug. In this apparatus, the above-mentioned series of operations can be accomplished only by moving the cord length carrier, having a predetermined number of blade-terminated cord lengths mounted thereon, from position 1 to position 3 along the endless rectangular guide track, leading to a marked improvement over prior art apparatus.

BRIEF DESCRIPTION OF THE DRAWINGS

FIG. 2(a) is a top view of the first half section of the automatic system for producing cord lengths with molded plugs constructed in accordance with the concepts of the invention;

FIG. 3 is an enlarged view, partly in section, showing the cord drawing-out means, the cutting means and the loading means, with the conveyor assembly partly shown;

FIG. 4 is an enlarged view, partly in section, showing the cutting means and the loading means, with the conveyor assembly, partly shown, and also showing the situation where a cord is cut and loaded on the conveyor assembly;

FIG. 9(a) is an enlarged partial view, partly in section, showing the terminal blade applying means and a portion of the conveyor assembly, as viewed from the right side of FIG. 1(a);

FIG. 9(b) is an enlarged partial view, partly in section, of the terminal blade applying means shown in FIG. 1(a);

FIG. 9(c) is an enlarged view of a cord length with terminal blades attached thereto;

FIG. 10 is an enlarged view, partly in section, showing the cord length releasing means, a portion of the conveyor assembly, and the device for simultaneously transferring a plurality of cord lengths;

FIG. 11 is an enlarged view, partly in section, of a portion of the terminal blade supporting means;

FIG. 12 is an enlarged view, partly in section, of a portion of the cord length supporting means;

FIGS. 13(a)-13(d) are enlarged views, partly in section, of a portion of the terminal blade supporting mechanism means in FIG. 11, showing how a pair of terminal blades are gripped by means of a terminal blade rotator and clamping legs;

FIG. 13(e) is an enlarged view, partly in section, of a portion of the terminal blade supporting means shown in FIG. 11, showing how a pair of terminal blades are inserted into a rectangular framework cord length carrier;

FIGS. 14(a)-14(e) are enlarged top views, partly in section, which correspond to FIGS. 13(a)-13(e), respectively;

FIG. 16(a) is a top view of the rectangular framework cord length carrier;

FIG. 16(b) is a rear view of the rectangular framework cord length carrier, with one side of the cord length carrier shown partly in cross-section, as viewed from the upper side of FIG. 16(a);

FIG. 16(c) is a cross-sectional front view of the cord length carrier shown in FIG. 16(a), as viewed from the lower side of FIG. 16(a);

FIG. 18 is a top view of the cord length carrier having cord lengths with plugs thereon.

FIGS. 19(a)-19(e) are diagrammatic views of the rectangular circulating guide passage with four cord length carriers, showing the movement of the four cord length carriers;

FIGS. 20(a)-20(d) are enlarged views, partly in section, of the third position in which the electric performance inspecting apparatus, the automatic taking-out and shifting device for inspection samples, and the cord chuck operating means are provided, showing how the molded plugs with cord lengths are picked up and introduced into the notches of the electric performance inspecting apparatus and how the inspected molded plugs with cord lengths are pulled out from the notches; and FIGS. 21(a)-21(d) are enlarged views, partly in section, which correspond to FIGS. 20(a)-20(d), respectively.

DESCRIPTION OF THE PREFERRED EMBODIMENT

Figure 1A:
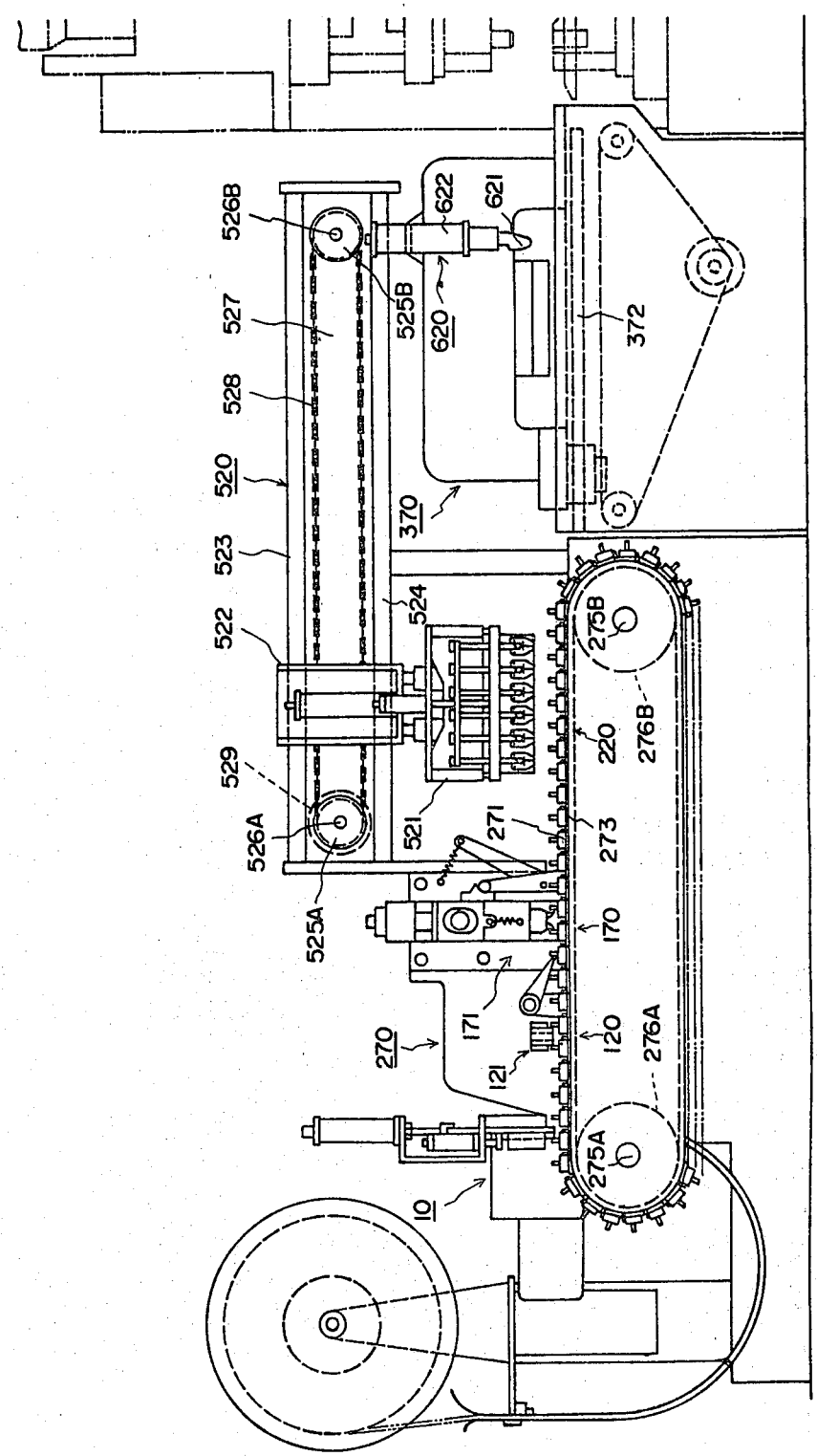
FIG. 1(a) is a side view of the first half section of the automatic system for producing cord lengths with molded plugs constructed in accordance with the concepts of the invention.

The following description is given for a full automatic production system for producing a cord length with a plug to which the present invention relates.

The entire side view and entire top view of the present system are shown in FIGS. 1(a) and 1(b) and FIGS. 2(a), and 2(b), respectively.

The operations at the first stage 120 include feeding a cord 1, cutting the cord 1 into predetermined lengths, clamping the cord lengths 1 at the position where the cord 1 is cut, and stripping the insulation of the cord lengths 1. The operations at the second state 170 comprises applying terminal elements or blades 175 to the stripped ends of the cord lengths 1. The operations at the third stage 220 include arranging a plurality of the cord lengths 1 with terminal blades 175 so as to be ready to transfer to the next process. The above-mentioned three stages are arranged in order along a conveyor assembly 270 which laterally transfers the cord lengths 1 intermittently. Next to the conveyor assembly 270, a carrier circulating machine 370 is installed which circulates a cord length carrier 320 that also serves as an auxiliary molding flask. A device 520 for simultaneously transferring a plurality of cord lengths 1 with terminal blades 175 is provided so as to move between the third stage 220 on said conveyor assembly 270 and the first position 372 of the circulating machine 370 which circulates the cord length carriers 320.

Figure 2B:
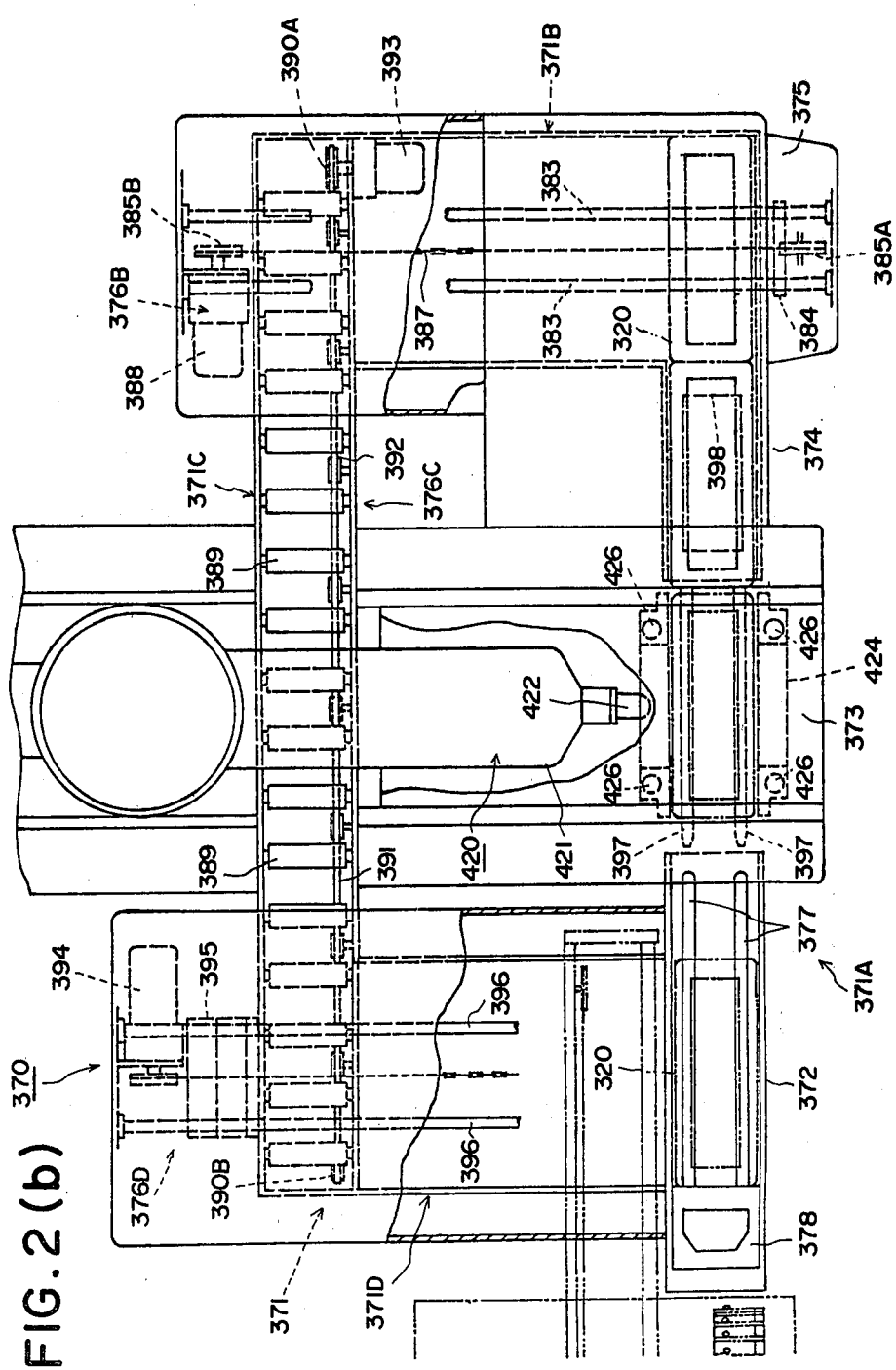
FIG. 2(b) is a top view of the latter half section of the automatic system for producing cord lengths with molded plugs constructed in accordance with the concepts of the invention.

The conveyor assembly 270 is provided with an endless belt 271 which rotates in a vertical plane. The carrier circulating machine 370 for transferring the cord length carriers 320 is provided with a circulating guide passage 371 along which the cord length carriers 320 are transferred. The circulating guide passage 371 has a rectangular shape as viewed from the top. One side of the circulating guide passage 371 is on the extension line of the endless belt 271 as depicted in FIGS. 2(a) and 2(b), respectively showing the top view of the conveyor assembly 270 and the carrier circulating machine 370.

As seen from FIGS. 2(a)-(2b) and FIGS. 19(a)-19(e), on the circulating guide passage 371, the cord length carrier 320 moves along the sides of the rectangular circulating guide passage 371. The manner of transfer of the cord length carrier 320 is as follows: The cord length carrier 320 starts from the first position 372, then is transferred to the second position 373, the third position 374, and the fourth position 375 in this order. The cord length carriers 320 are intermittently transferred.

At the second position 373 of the first side 371A of the circulating guide passage 371, a molding machine 420 for forming a plug casing is installed. At the third position 374, an electric performance inspecting apparatus 470 and an automatic taking-out and shifting device 670 for inspection samples are provided.

Figure 5:
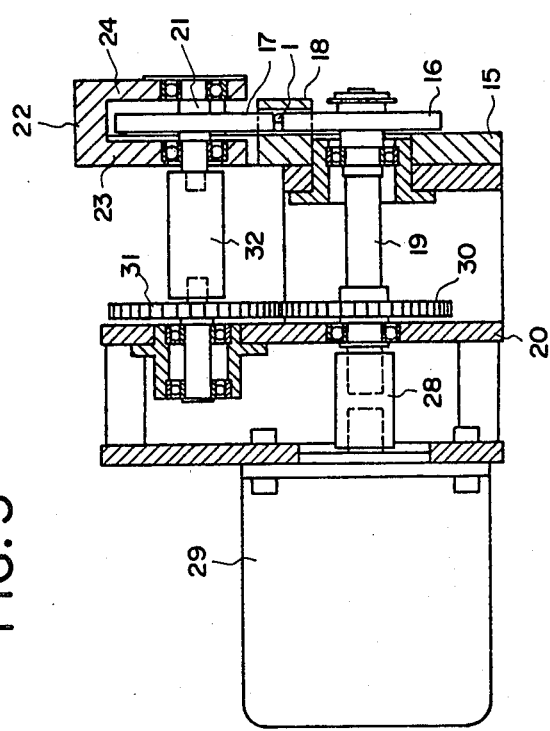
FIG. 5 is an enlarged view, partly in section, of the cord drawing-out means shown in FIG. 2(a)

More particularly, a cord drawing-out unit 10, as shown in FIG. 2(a), comprises a feed bobbin 11 with a cord consisting of a pair of insulated conductors wound thereon; a motor 12 for rotating the feed bobbin 11; a cord drawing-out means 13 which is adapted to draw-out a predetermined length of the cord 1 and which is located adjacent to the endless belt 271 of the conveyor assembly 270; and a cutting means 14 whose movement in synchronism with the movement of the cord drawing-out means 13. The cord drawing-out means 13, as shown in FIGS. 3 and 5, comprises a drawing-out roller 16 and a hold-down roller 17 which are each provided on one side of a main frame 15 and a cord through-guide 18 which is attached to said main frame 15. The cord drawing-out means 13 supplies a cord 1, which has been fed from the feed bobbin 11, to above the endless belt 271 of the conveyor assembly 270 through the cord through-guide 18 and between both the rollers 16 and 17. The drawing-out roller 16, as shown in FIG. 5, is attached to one end of the driving shaft 19 provided between the main frame 15 and the subframe 20 beside the main frame 15. The hold-down roller 17 is located above the drawing-out roller 16. The support shaft 21 of the hold-down roller 17 is provided between side support plates 23 and 24 of a support arm 22. The support arm 22, as shown in FIG. 3, is attached to the main frame 15 through a main shaft 25 so that it can move up and down freely. Further, since a lever 26 attached to said support arm 22 through the main shaft 25 is pulled by a spring 27, the hold-down roller 17 can hold down the drawing-out roller 16. As shown in FIG. 5, since the driving shaft 19 of the drawing-out roller 16 is coupled to a pulse motor 29 through a coupling 28, the driving force of the motor 29 is also transmitted to said support shaft 21 through a gear 30 mounted on the driving shaft 19, another gear 31 mounted on the subframe 20, and a universal joint 32. By the turning force of both rollers 16 and 17, the cord 1, which have been supplied from the feed bobbin, is forwarded to the endless belt 271. With the above-mentioned arrangement, the length of the cord can be accurately measured by means of the pulse motor 29.

Figure 6:
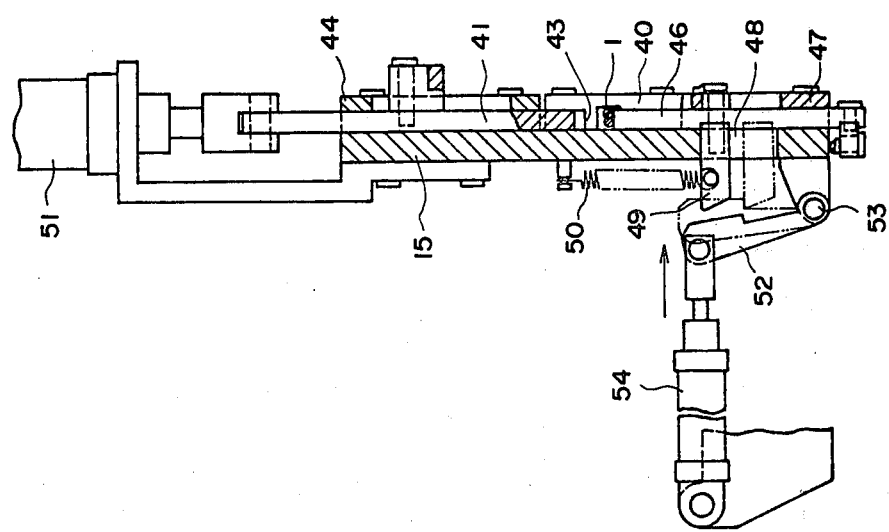
FIG. 6 is an enlarged view, partly in section, of the cutting means shown in FIGS. 1(a) and 2(a)

A cutting means 14 for cutting the drawn-out cord into a predetermined length, as shown in FIGS. 3, 4, and 6, comprises a fixed tool 40 which also serves as part of a cord through-guide 18 and a movable tool 41 which moves up and down in front of the fixed tool 40. The cord 1 to be cut passes through the fixed tool 40 and then passes under the movable tool 41. The fixed tool 40 is fixed on the main frame 15. The sharp edge 42 of the fixed tool 40 is located on the extension line of the cord through-guide 18, and the movable tool 41 is fitted in a tool guide 44 to move up and down freely. Further, at the lower end of the movable tool 41, a hold-down surface 45 is formed which is to push down the cut-off side of the cord 1 that is going to be cut and which is in front of the sharp edge 43 of the movable tool 41. On the other hand, opposite to the hold-down surface 45, a support 46 for supporting said cord 1 is provided in a support guide 47 to move up and down freely. As shown in FIG. 6, a latch 49 which is provided on one side of the support 46 is pulled upward by a spring 50, so that the upper face of the support 46 is usually in the plane of the sharp edge 42 of the fixed tool 40. Further, an air cylinder unit 51 which operates the moving tool 41 is attached to the upper side of the movable tool 41.

As shown in FIG. 6, a hook lever 52 is pivotally mounted on a support shaft 53 provided on the main frame 15 to retain said support 46 after the cord 1 has been cut. The hook lever 52 is connected to an air cylinder unit 54 so that the hook lever 52 is operated.

In the cord drawing-out unit 10 thus constructed, when the cord 1, which is fed to above the endless belt 271 provided over the conveyor assembly 270 as described above, reaches a predetermined length, said pulse motor 29 stops not only to discontinue the feeding of the cord 1 but also to permit said air cylinder unit 51 of the cutting means 14 to operate, so that the movable tool 41 is lowered. The above situation is shown in FIG. 4. It should be noted that the rear end of the cord 1 is cut by the shearing force generating by cooperation of the sharp edge 43 of the movable tool 41 with the sharp edge 42 of the fixed tool 40 while being held down on the support 46 by the action of the hold-down surface 45 of the movable tool 40. The support 46 is pushed down by the action of the hold-down surface 45 of the movable tool 41 with the end portion of the severed cord 1 placed on said support 46, which causes the support 46 to descend against the tension of the spring 50 acting on the latch 49. Then the air cylinder unit 54 operates, causing the hook lever 52 to move as shown in FIG. 6 by two-dot chain lines. Thereby the latch 49 which has been lowered to the position that is also shown in FIG. 6 by two-dot chain lines engages the hook lever. Consequently, even when the air cylinder unit 51 operates to raise the movable tool 41, said support 46 remains lowered. This favorably does not allow the end portion of the severed cord 1 to spring out and to bend.

Figure 7:
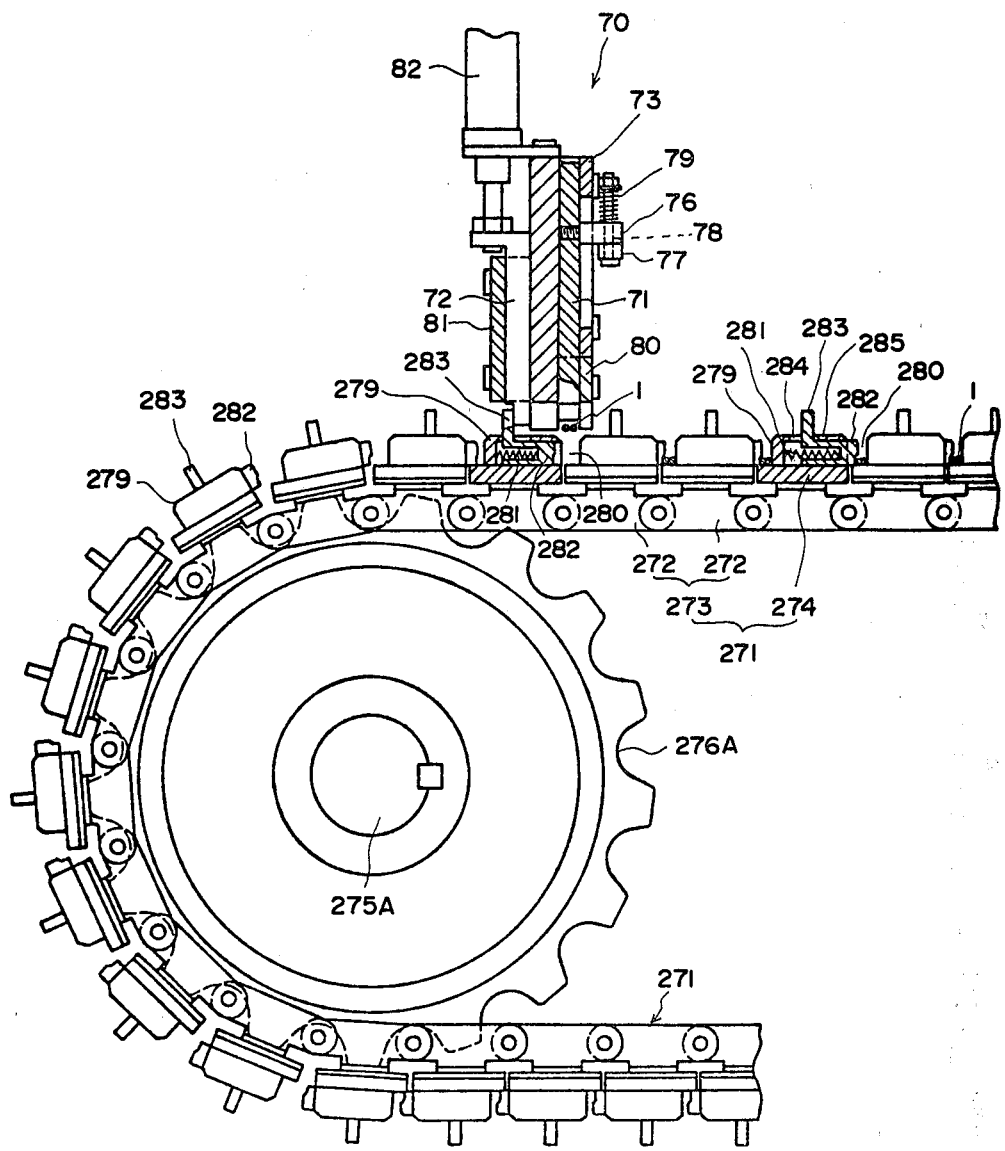
FIG. 7 is an enlarged view, partly in section, showing the loading means and a portion of the conveyor assembly shown in FIGS. 1(a) and 2(a)

As shown in FIGS. 1, 4, and 7, the conveyor assembly 270, which laterally carries the cord length 1 toward the next process, comprises the endless belt 271 having a generally oval shape. The endless belt 271 has a chain 273 comprising a number of links 272 and a number of plates to which said links 272 are attached. The chain 273 included in the endless belt 271 is turned over a pair of sprockets 276A and 276B which are pivotally mounted on horizontal support shafts 275A and 275B, respectively and which rotate in a vertical plane. As shown in FIGS. 3 and 4, said plates 274 are provided along a pair of guide rails 278A and 278B to slide freely. Each of the plates 274 rides on its end portions which have a cutout portion 277, on the pair of guide rails 278A and 278B positioned on each side of the sprockets 276A and 276B. The pair of guide rails 278A and 278B are arranged in vertical planes facing each other. The horizontal support shafts 275A and 275B are rotated intermittently by means of a driving motor, causing not only the chain 273 to rotate intermittently but also each of the plates 274 to move along the guide rails 278A and 278B. In other words, the endless belt 271 is intermittently rotated along the oval shape of the guide rails 278A and 278B in a vertical plane. On each plate 274 of the endless belt 271, a number of cord length holding blocks 279 are provided for holding said severed cord lengths 1. The cord length holding block 279, as shown mainly in FIG. 7, is provided with a cord length holder 282 which is pushed out toward the preceding cord length holding block 279 by means of a compression spring 281. A pin 283 which is formed integrally with the cord length holder 285 protrudes out through an opening 284 of the upper wall 281 of the cord length holding block 279. When the pin 283 is laterally pushed against the action of the compression spring 281, the cord length holder 282 is moved back to provide a larger space between the cord length holder 282 and the preceding cord length holding block 279. When the force pushing the pin 293 laterally is removed, the cord length holder 282 will return to the original position by the action of the compression spring 281, causing a space 280 between the cord length holder and the preceding holding block to be narrowed. In other words, by the above-mentioned operations of the pin 283 and the cord length holder 282, the cord lengths 1 can be held in the space 280 between two cord length holding blocks 279 and released therefrom.

The cord 1 which has been fed to the above endless belt 271 of the conveyor assembly 270 is held in the space 280 between two cord length holding blocks 279 after the cord 1 is cut. In order to carry out these operations automatically, a loading means 70 is combined with the cutting means 14 above the endless belt 271 where the cord 1 is fed. As shown in FIGS. 3, 4, and 7, the loading means 70 is provided with a pusher 71 at the place where the cord 1 is fed. As shown in FIG. 7, the loading means 70 is also provided with an opener 72 on the left of the pusher 71. The pusher 71 is fitted in a pusher guide 73 to move up and down freely which guide is fixed forwardly of the movable tool guide 44 with respect to the feeding direction of the cord 1. The pusher 71 has a branched leg 75 having hold-down surfaces 74A and 74B to push the cord 1 into the space 280 between two cord length holding blocks. The pusher 71 is connected to the movable tool 41 through a stud pin 76 and a lever 77 so that the up and down movements of the pusher 71 is synchronized with the movements of the movable tool 41. That is, as shown in FIGS. 3, 4, and 7, when the movable tool 41 is lowered, a spring 79 mounted on a rod 78 is compressed through a lever 77, causing the pusher 71 to be lowered through the stud pin 76, thereby pushing down the cord 1. After the cord 1 has been cut off to a predetermined length, the movable tool 41 is elevated, thereby the pusher 71 is elevated through the stud pin 76. A guide plate 80 provided on the main frame 15 is located under the pusher guide 73 so that the feed cord 1 comes just under the pusher 71 and just over the space 280 between two cord length holding blocks. On the other hand, the opener 72 located on the left of the pusher 71 is provided in the opener guide 81 fixed on the main frame 15 so that the opener 72 can move up and down freely. The upper portion of the opener 72 is connected to an air cylinder unit 82, so that the opener is operated by the air cylinder unit 82.

In the loading means 70 thus constructed, the opener 72 is usually lowered by means of said air cylinder unit 82. When the cord length holding block 279 which is moved by intermittent rotation of the endless belt 271 by a distance corresponding to the length of each of the links 272, reaches the position of the opener 72, the pin 283 of the cord length holder 282 contacts the opener, thereby preventing the cord length holder 282 from advancing. Therefore, though the cord length holding block 279 advances pin 283 and the cord length holder 282 are pushed back against the action of the compression spring 281, causing the forward portion of the cord length holder 282 to be drawn back into the cord length holding block 279. As a result, a large space will be formed between the two cord length holding blocks 279. As soon as the formed space 280 is positioned just under the pusher 71, the intermittent movement of the cord length holding block 279 stops. Then the cord 1 is guided to just above the formed large space 280 through between the movable tool 41 and the support 46. When the predetermined length of the cord 1 is fed and the movable tool 41 is lowered to cut the cord 1, the pusher 71 is also lowered and the pusher surfaces 74A and 74B of the branched leg 75 of the pusher 71 push down the cord 1 onto the plate 274 of the endless belt 271.

Consequently, the cord length 1 severed in this way is placed in the space 280 between two cord length holding blocks simultaneously with cord cutting. After this, the pusher 71 rises together with the movable tool 41 and the air cylinder unit 82 is operated to raise the opener 72. The pin 283 will be disengaged from the opener 72, causing the cord length holder 282 to advance into the space 280 between two cord length holding blocks by means of the compression spring 281. As a result of this, the cord length 1 loaded in the space 280 will be pressed against the cord length holding block 279 which is positioned ahead with respect to the advancing direction of the cord length holding block 279, assuring that the cord length 1 is tightly gripped between two adjacent cord length holding blocks 279. In this way, the severed cord length 1 is held in the space 280 between two adjacent cord length holding blocks which are intermittently advanced one after another.

Figure 8A:
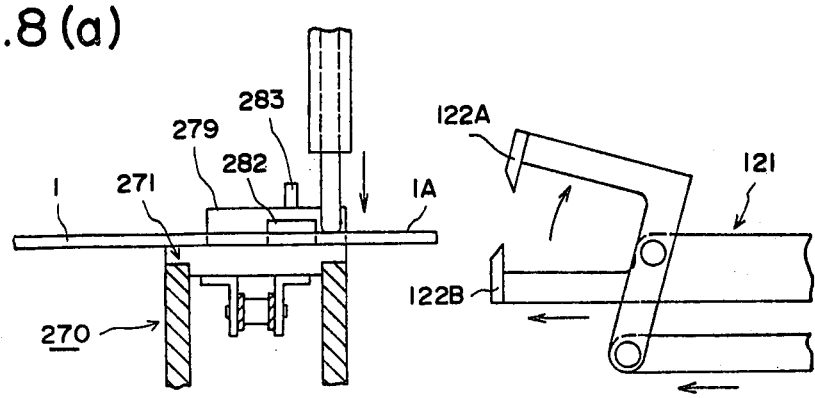
FIGS. 8(a)-8(c) are enlarged partial views, partly in section, of the insulation stripping means and the conveyor assembly shown in FIGS. 1(a) and 2(a), showing how the insulation of a cord length is stripped.
Figure 8B:
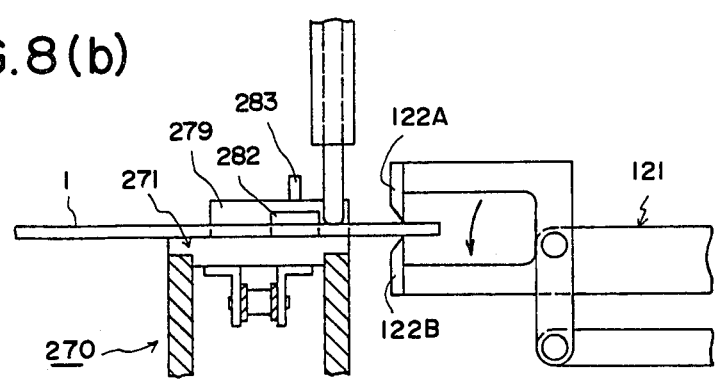
Figure 8C:
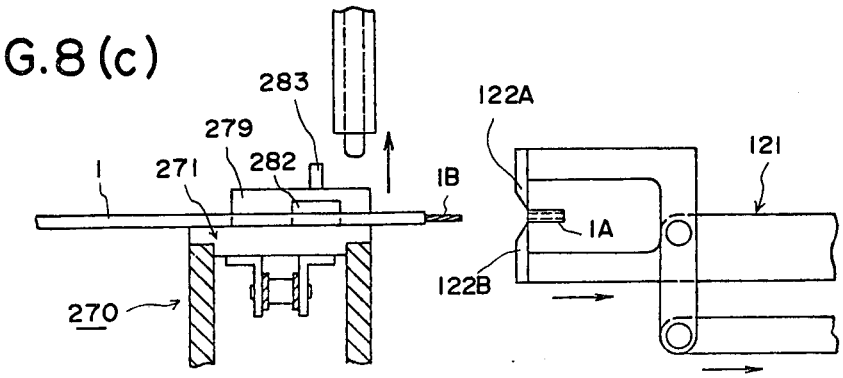
Figure 8D:
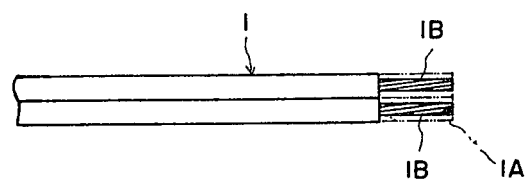
FIG. 8(d) is an enlarged view of the stripped cord by means of the insulation stripping means.
Figure 15:
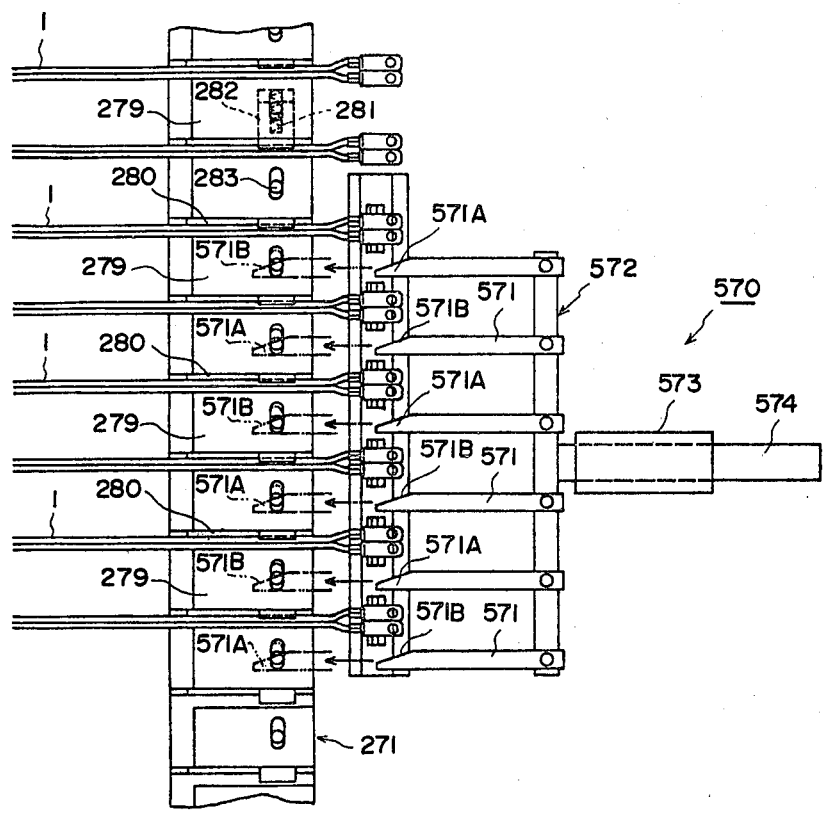
FIG. 15 is an enlarged top view of the cord length releasing means shown in FIGS. 2(a) and 10.

The gripped cord length 1 is moved laterally toward the first stage section 120 where the insulation of the cord length 1 is stripped. At this stage, as shown in FIGS. 8(a), 8(b) and 8(c), the insulation 1A of the cord length 1 is stripped by means of an insulation stripping means 121 including an upper jaw blade 122A and a lower jaw blade 122B, so that predetermined lengths of the electric conductors of the cord length 1 is exposed. Then the stripped cord length 1 is moved laterally toward the second stage section 170 where the terminal blades are applied. At this stage, as shown in FIGS. 9(a), 9(b) and 9(c), the insulated portion of the cord length 1 is branched by a branching blade 172 provided in a terminal blade applying means 171. The branched portion 173 is shown in FIG. 9(c). Immediately after this, the exposed portions of the cord length 1 are supplied in each U-shaped portion 176 of terminal blades which are fed by means of a terminal blade transferring pawl 174. Then each of the U-shaped portions 176 of terminal blades are pressed by a press member 177 to apply terminal blades 175 to the cord length 1. The terminal blades transferring pawl 174 is operated by means of a cam (not shown). The terminal blade transferring mechanism used is well known. Further, said insulation stripping means 121 and terminal blade applying means 171 are also not novel. Well-known techniques can be used in these stages 120 and 170.

Next, the cord lengths 1 with terminal blades 175 attached are laterally carried toward the third stage section 220 where a plurality of the cord lengths 1 with terminal blades 175 (six of the cord lengths 1 with terminal blades 175 in this embodiment are arranged with the cord lengths 1 held between two adjacent cord length holding blocks 279. The third stage section 220 as seen in FIGS. 10 and 11, involves a table 221 on which said six of cord lengths 1 with terminal blades are placed, and which is located at the back of the endless belt 271. The table 221 is provided with a plurality of terminal holders 222 in arrangement according to the number of the arranged cord lengths 1 and the positions of the arranged cord lengths 1. In this embodiment, the table 221 is provided with six terminal holders 222. Each terminal holder is free to move up and down. The upper part of each terminal holder 222 is divided into two parts 224 and 225 by a recess 223 which opens upwardly. The parts 224 and 225 are provided with V-shaped recesses 228 and 229 having, on their respective both sides, inclined planes 226A and 226B and 227A and 227B, respectively. Each terminal holder 222 is connected to a pushing-up link 231 through a leg 230. The upper end of the terminal holder 222 is usually aligned with the upper face of the table 221. Only when said pushing-up link 231 rises, each terminal holder 222 is pushed up by the action of a spring 232.

More particularly, the cord length holding means 521 attached to the transfer block 522 includes, as seen in FIGS. 10 and 12, a frame 532, a plurality of terminal blade supporting means 533 provided at one end portion of the frame 532, and a plurality of cord length supporting means 534 provided at the other end portions of the frame 532. The frame 532 is free to move up and down with respect to the transfer block 522 since the frame 532 is connected to an air cylinder unit 531. The number of terminal blade supporting means and that of cord length supporting means are not critical (six is used in this embodiment). The following explanation on each of the above-mentioned means will be given with respect to each one:

The terminal blade supporting means 533 grips a pair of terminal blades 175 which are attached to a cord length 1 and the cord length supporting means 534 holds each cord length 1. The terminal blade supporting means is provided with a lower projection 535, a terminal blade rotator 536, a pair of clamping legs 538A and 538B, a terminal ejector 539 and a terminal separating rod 540. The lower projection 535 is positioned to be inserted in the recess 223 of said terminal holder 222. The terminal blade rotator 536 is fixed on the frame 532 and a pair of clamping legs 538A and 538B are provided along both sides of the terminal blade rotator 536. The lower legs 537 of the clamping legs 538A and 538B are inserted in the recess 223 in the same manner as said lower projection 535. The terminal ejector 539 provided at the rear of the terminal blade rotator 536 is free to move up and down with respect to the frame 532. The terminal separating rod 540, which is spaced from the terminal blade rotator 536, is also free to move up and down with respect to the frame 532. Steps 541A and 541B are provided at the upper portion of the lower projection 535 of the terminal blade rotator 536. The pair of clamping legs 538A and 538B are pivotally mounted on upper pins 542A and 542B provided on the frame 532. The two clamping legs 538A and 538B are biased to clamp in cooperation with the terminal blade rotator 536 by means of a tension spring 543 attached to the two clamping legs 538A and 538B. The inner side of each leg 537 attached to leg 538A is tapered with an inclined plane 544, and reverse V-shaped spaces 545 are formed between the lower projection 535 of the terminal blade rotator 536 and the inclined planes 544. Narrow terminal blade clamping spaces 546 terminate at 541A and 541B and, on the other hand, communicate with the reverse V-shaped spacings 545. The upper portion of the terminal ejector 539 and that of the terminal separating rod 540 are connected to air cylinder units 547 and 548, respectively.

The cord length supporting means 534 includes a recess 549 for gripping a cord length at the lower end of the cord length supporting means 534, a pair of jaw members 552A and 522B pivoted about the upper pins 551A and 551B, which pins are provided on the front of a vertical plate portion 550 of the frame 532, and a jaw opening rod 553 which is adapted to be inserted between the pair of jaw members 552A and 552B and is free to move up and down with respect to the frame 532. The pair of jaw members 552A and 552B are usually biased to a closed position by the action of a tension spring 554 attached to both jaw members 552A and 552B and cord gripping recesses 555 are provided at the lower portions of the pair of jaw members 552A and 552B. The upper portion of the jaw opening rod 553 is connected to an air cylinder unit 557 through a horizontal plate 556.

Further, in this embodiment, the cord length holding means 558 for holding down a portion of the cord length 1, which portion is near the terminal blades 175 is provided between the terminal cord length supporting means 533 and the blade supporting means 534. The cord length holding means 558 includes a support rod 559 which is fitted in a hole of the frame 532 to move freely up and down with respect to the frame 532 and an L-shaped plate 560 which is fixed to the lower portion of the support rod 559. The bent portion 561 of said L-shaped plate 560 is provided with recesses 562 for gripping the cord at the lower portion of the bent part 561. The number of recesses 562 corresponds to the number of cord lengths. The upper portion of the support rod 559 is connected to an air cylinder unit 563.

In operation, the cord length holding means 521 is stopped just above the third stage section 220 to remove a plurality of cord lengths with the terminal blades. The terminal separating rod 540 and then the L-shaped plate 560, as seen in FIGS. 13(a) and 14(a), are lowered by means of the air cylinder units 548 and 563. The terminal separating rod 540 will break into a pair of pressed parts 178 of the terminal blades 175 to enter a recessed portion 223 (see FIG. 10) of the table 221, causing the space between the pair of terminal blades 175 to widen a little. On the other hand, the L-shaped plate 560 holds down portions of the cord lengths which are near the terminal blades 175 to retain the cord lengths 1 at the placed position by means of the recesses 562 of the L-shaped plate 560. Then, as seen in FIGS. 13(b) and 14(b), the pushing-up link 231 is elevated by means of an air cylinder unit (not shown) to raise the terminal holder 222 and the frame 532 is lowered by means of the air cylinder unit 531. As the terminal holder 222 is raised, the pair of the terminal blades 175 on the table 221 are caused to be inclined, in symmetrical relationship, according to the inner inclined surfaces of the two V-shaped recesses 228 and 229 provided on the upper portion of the terminal holder 222. Subsequently, the lower projection 535 of the terminal blade rotator 536 is lowered going through the pair of terminal blades 175 and into the recess 223 formed in the terminal holder 222. Simultaneously with the operation, a pair of the clamping legs 538A and 538B go into recess 223 outside of the terminal blades 175. Accordingly, the inner sides of each terminal blade 175 are pushed down by means of the lower projection 535 and the outer sides of each terminal blade 175 are pushed up by means of the inclined surfaces 226A, 226B, 227A and 227B of the V-shaped recesses 228 and 229, thus causing the horizontally placed terminal blades 175 to turn and move into the space between the lower projection 535 and both the clamping legs 538A and 538B.

After this stage, it is no longer necessary to hold down the cord length 1 by means of the L-shaped plate 560. Therefore, the L-shaped plate 560 is elevated by means of the air cylinder unit 563 to disengage the cord length 1 from the L-shaped plate 560. Next, as shown in FIGS. 13(c) and 14(c), when the frame 532 is further lowered, both the terminal blades 175 will rest on the inclined surfaces 226A, 226B, 227A and 227B of the V-shaped recesses 228 and 229. When the frame 532 is further lowered against the action of the spring 232 of the terminal holder 222, each terminal blade 175 will touch the upper face of the table. But the frame 532 is lowered further, allowing the lower projection 535 and the legs 537 of the clamping legs 538A and 538B to enter the recess 223 of the terminal holder 222. Consequently, after each terminal blade 175 has touched the upper face of the table 221 as described above, the terminal blades 175 are separated from each other by means of the lower projection 535 of the terminal blade rotator 536 and guided by each inclined inner surface 544 of the legs 537 of the clamping legs 538A and 538B so that the terminal blades are further turned or rotated. Finally, the terminal blades 175 are guided into the terminal blade-clamping space 546 so that the two terminal blades 175 are aligned with each other in parallel vertical planes.

On the other hand, while the above-mentioned operations are carried out, the jaw opening rod 553 is pushed down by means of the air cylinder unit 557 to open the pair of jaw members 552A and 552B. After the cord length 1 is inserted into cord gripping recesses 555, the jaw opening rod 553 is raised by means of the air cylinder unit 557 to close the pair of jaw members 552A and 552B. Thereby, as seen in FIG. 14(c), a portion of the cord length 1 near the portion which is held down by means of a recess 549 of the vertical plate 550 is gripped by the pair of jaw members 552A and 552B through a tension spring 554. In this instance, the terminal separating rod 540 is already elevated. When the frame 532 is elevated by means of the air cylinder unit 531, each terminal blade 175 inserted into each terminal blade-clamping space 546, as shown in FIGS. 13(d) and 14(d), is retained in each terminal blade-clamping space 546 and raised together with the frame 532. This is so because each terminal blade 175 is tightly gripped by both the force of restitution in the cord caused by torsion of the cord, which torsion originates from 90° rotation of the terminal blades, and the pushing force resulting from the action of the tension spring 543 provided on both the clamping legs 538A and 538B. Simultaneously with the raising of the terminal blades 175, the rear portion of the cord length 1 clamped by the pair of jaw members 552A and 552B is also raised.

In this way, a plurality of cord lengths 1 with terminal blades are simultaneously taken out of said third stages section 220, with the plurality of cord lengths 1 being arranged in a row with pairs of terminal blades 175 being aligned with each other in parallel vertical planes. It should be noted that rotating of the terminal blades 175 of the plurality of the cord lengths 1 and taking out the plurality of the cord length 1 with the terminal blades 175 from the third stage section 220 can be carried out at one time by means of the cord length holding means 521.

When the cord length holding means 521 simultaneously takes out the plurality of the cord lengths 1 with the terminal blades 175, it is required to release the cord length 1 held in the space 280 between the two cord length holding blocks 279. In order to release the cord lengths 1, a cord length releasing means 570 is provided at the rear of the endless chain 271 of the third stage section 220. The cord length releasing means 570 includes a comb 572 having teeth 571 with tapering tips 571A, a slide rod 574 of which the one side is fixed to the middle portion of the comb 572 and of which the other side is inserted through the guide block 573 to slide freely, and an air cylinder unit 575 which reciprocates the slide rod 574. The air cylinder unit 575 advances the slide rod 574 toward the endless belt 271, causing the sides 571B of the tapering tips 571A of each teeth 571 to push the pins 283 backward against the compression spring 281. Thereby the pins 283 are moved backward, causing the cord length holders 282 and the pins 283 formed integrally therewith to enter the inside of the cord length holding blocks 279. As a result, the space 280 between two cord length holding blocks 279 will be widened, causing the cord length 1 to be released. After said cord length holding means 521 has simultaneously taken out the cord lengths 1, the comb 572 is moved backward by means of the air cylinder unit 575. As a result, the pins 283 will be disengaged from the teeth 571 of the comb 572. The cord length holding means 521, which has picked up the plurality of the cord lengths 1 with the terminal blades 175 from the third stage section 220 at one time, is laterally transferred to a carrier circulating machine 370 by means of a driving motor 529 where the taken-out cord lengths 1 are loaded in a cord length carrier 320 which also serves as an auxiliary molding flask.

The plurality of the cord lengths 1 with terminal blades 175 which have been set to be moved for the next process and are taken out from the third stage section 220 are carried to the first position 372 of the circulating guide passage 371 provided on the carrier circulating machine 370. The carried cord lengths 1 with terminal blades 175 are set in the cord length carrier 320 which also serves as an auxiliary molding flask. In order to carry out this operation, the device 520 for simultaneously transferring a plurality of cord lengths 1 is provided so as to move between the conveyor assembly 270 and the carrier circulating machine 370, as seen in FIGS. 1(a) and 2(a). The device 520 for simultaneously transferring a plurality of cord lengths 1 is provided with a cord length holding means 521 which can hold a plurality of arranged cord lengths 1 at one time and also release them at one time. The cord length holding means 521 is connected to a transfer block 522, which is attached to two parallel guide rods 523 and 524 to slide freely, the two parallel guide rods being positioned between the third stage section 220 and the first position of the carrier circulating machine 370. A pair of sprockets 525A and 525B are pivotally mounted on horizontal support shafts 526A and 526B provided on a frame 527 for free rotation in a vertical plane. An endless chain 528 is set on the sprockets 525A and 525B. The horizontal support shaft 526A is connected to a motor 529 which reciprocates the transfer block 522, and the transfer block 522 is fixed to said endless chain 528 through a coupling member 530 at the back of the transfer block 522. Thus, when the motor 529 drives the endless chain 528 clockwise or counter-clockwise, the cord length holding means 521 moves between the third stage section 220 and the first position 372 of carrier circulating machine 370. In short, the device 520, for simultaneously transferring a plurality of cord lengths, can simultaneously take a plurality of cord lengths 1 with terminal blades, which have been set at the third stage section 220, out of the third stage section 220 and simultaneously carry them to the circulating machine 370 by means of the cord length holding means 521.

The cord length carrier 320 is first placed in the first position 372 of the first side 371A of the circulating guide passage in the carrier circulating machine 370. The cord length holding means 521, having come from said third stage section 220 of the conveyor assembly, is stopped just above the first position 372 of the first side 371A of the circulating guide passage 371.

The cord length carrier 320 on which the transferred cord lengths 1 with terminal blades 175 are loaded comprises, as seen in FIGS. 16(a) and 16(c), a rectangular frame 323 composed of four sides 321A, 321B, 321C and 321D. The frame 323 has therein a space 322 which is adapted to fit over a drag 424. The side member 321A is provided with a plurality of recesses 324 for receiving terminal blades. As shown in FIGS. 16(a) and 16(b), in each pair of recesses 324, there are inserted a pair of balls 335 with a compression spring 334 disposed therebetween. The opposite side 321B is provided with a plurality of cord chucks 325 corresponding to the pair of recesses 324 for receiving the terminal blades. Each cord chuck is composed of a cord inserting groove 326 provided in the side 321B, a cord holding member 328, and a torsion spring 329. The cord holding member 328 is pivoted about a pin 327 provided at the side of the cord inserting groove 326. The torsion spring 329 is mounted on the pin 327 so that the head 328A of the cord holding chuck 328 covers the cord inserting groove 326.

Further, a sliding rod 330 is provided in the bottom of the side 321B. The sliding rod 330 includes a head 332 to be pressed and recesses 331 corresponding to the number of cord chucks 325. The recesses 331 engage the leg 328B of the cord holding member 328 and the head 332 provided at one end of the sliding rod 330 is positioned in an opening 333 to slide freely. Usually, the cord holding members 328 are turned clockwise by means of the torsion springs 329 to cover the core inserting grooves 326 with the heads 328A of the cord holding members 328, with the sliding rod 330 being slid to the left by the legs 328B of the cord holding members 328. As seen in FIG. 16(c) by a two-dot chain line, when the pushing rod 621 of a cord chuck operating means 620 (shown in FIG. 1(a) is inserted into the opening 333 to slide the head 332 to the right, the sliding rod 330 attached to the head 332 is also slid to the right against the action of the torsion springs 329. Thereby, the cord holding members 328 are counterclockwise turned to uncover the cord inserting grooves 326. In short, the pushing rod 621 of the cord chuck operating means 620 is inserted into the opening 333 by means of an air cylinder unit 622, causing the cord chucks 325 to open. The pushing rod 621 is pulled up by means of the air cylinder unit 622 from the opening 333, allowing the cord chucks 325 to close again.

After the cord chucks 325 are opened simultaneously as described above, the cord length holding means 521 having a plurality of cord lengths 1 with terminal blades 175 is positioned just above the first position 372 of the circulating guide passages 317. The holding means 521 is lowered on the cord length carrier 320 in the first position 372 by means of the air cylinder unit 531 (see FIG. 10). Then the terminal ejector 539 is lowered by means of the air cylinder unit 547 to push downward each terminal blade 175 held in the terminal blade-clamping space 546, so that the terminal blades 175 are simultaneously inserted into the recesses 324 of the cord length carrier 320. Immediately after the inserting of the terminal blades 175, the balls 335 in the recesses 324 will push the terminal blades 175 by the action of the springs 334, assuring that each terminal blade 175 is tightly held. On the other hand, the operation of the air cylinder unit 557 (see FIG. 10) is synchronized with the lowering motion of the terminal ejector 539, so that simultaneously with the lowering of the terminal ejector 539, the jaw opening rod 553 is lowered to open the pair of jaw members 552A and 552B. As a result, simultaneously with the lowering of the terminal ejector 539, the cord lengths 1 gripped by the jaw members 552A and 552B are placed in the cord inserting grooves 326.

After this operation, each cord chuck 325 is simultaneously closed by means of the cord chuck operating means 620, allowing the cord lengths 1 to be gripped tightly in the side 321B of the cord length carrier 320. In this way, as shown in FIG. 16(a) by two-dot chain lines, a plurality of cord lengths 1 with terminal blades 175 are automatically loaded in the cord length carrier 320, with each pair of terminal blades 175 being aligned with each other and in parallel vertical planes. The cord length carrier 320 loaded with a plurality of cord lengths 1 with terminal blades 175 is moved intermittently from said first position 372 to the second position 373, then to the third position 374 on the first side 371A of the circulating guide passage 371 of the carrier circulating machine 370 (shown in FIGS. 1(b) and 2(b)). A plug casing forming molding machine 420 and an electric performance inspecting apparatus 470 are provided at the second position 373 and the third position 374, respectively. Therefore, a plurality of cord lengths 1 with terminal blades 175 are laterally moved to the plug casing-forming molding machine 420 and then to the electric performance inspecting apparatus 470 intermittently.

The circulating guide passage 371 is rectangular in shape as viewed from the top. Along the circulating guide passage 371 is circulated the cord length carriers 320. The cycle of circulation of the cord length carriers 320 starts at the first side 371A. Next, a cord length carrier 320 is transferred to the second side 371B, then to the third side 371C, then to the fourth side 371D and, finally, returned to the first side 371A. At the first side 371A, a carrier moving means 376A for transferring the cord length carrier 320 from the first position 372 to the second position 373 is provided. The carrier moving means 376A includes parallel guide grooves 377 provided in the first position 372 of the first side 371A of the circulating guide passage 371, and a pushing member 378 which reciprocates along the parallel guide grooves 377. An endless chain 379 is fixed to the bottom portion 378A of the pushing member 378, and a pair of sprockets 380A and 380B, which are provided under the first position 372 at both ends of a longitudinal portion corresponding to the length of the first position 372, engage said endless chain 379. A sprocket 381 is provided at a lower position (lower than those of said sprockets 380A and 380B) and is between the sprockets 380A and 380B. A motor 382 drives the sprocket 381. The motor 382 reciprocates the pushing block 378 through the endless chain 379 and the sprockets 380A, 380B and 381. Thereby, the cord length carrier 320, which is in the first position 372, is pushed toward the second position 373 repeatedly.

Figure 17A:
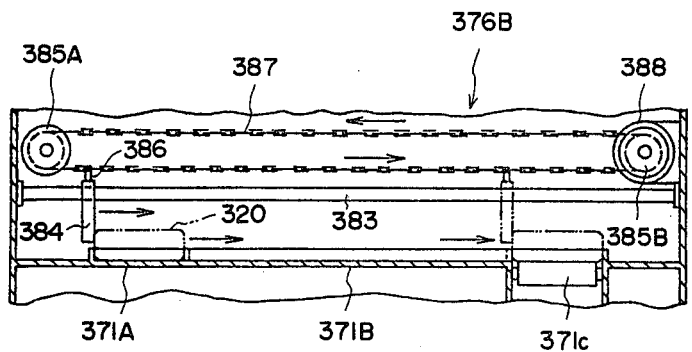
FIG. 17(a) is a view, partly in section, of the carrier moving means located at the second side of the rectangular circulating guide passage shown in FIG. 2(b), as viewed from the right side of FIG. 2(b)

As seen in FIGS. 2(b) and 17(a), at the second side 371B is provided a carrier moving means 376B which moves the cord length carrier 320 from the fourth position 375 on the first side 371A to the starting position of the third side 371C. The carrier moving means 376B comprises two parallel guide rods 383 which are provided along the entire second side 371B. A pushing member 384 is provided on the parallel guide rods 383 to slide freely. A pair of sprockets 385A and 385B are provided near the ends of parallel guide rods 383, an endless chain 387 is turned over both the sprockets 385A and 385B and is fixed to the pushing member 384 through a connecting member 386, and a motor 388 rotates the one sprocket 385B clockwise or counterclockwise. Therefore, the motor 388 reciprocates the pressing member 384 along the parallel guide rods 383, whereby the cord carrier 320 which has been transferred to the fourth position 375 on the first side 371A is pushed toward the starting position of the third side 371C repeatedly.

Figure 17B:
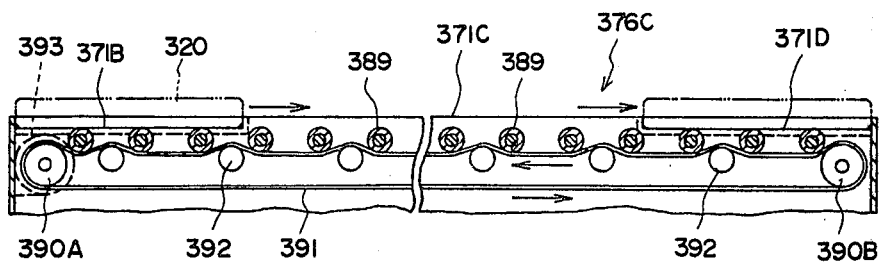
FIG. 17(b) is a view, partly in section, of the roller conveyor located at the third side of the rectangular circulating guide passage shown in FIG. 2(b), as viewed from the upper side of FIG. 2(b)

The third side 371C, as seen in FIGS. 2(b) and 17(b), comprises a roller conveyor 376C which can transfer the cord length carrier 320 from the starting position of the third side 371C to the end position, that is, the starting position of the fourth side 371D. The roller conveyor 376C comprises a number of rollers 389 arranged at appropriate intervals, and a pair of sheaves 390A and 390B positioned near each end of the third side 371C, and endless belt 391 which engages both sheaves 390A and 390B. Idle sheaves 392 which are arranged at appropriate intervals to press the endless belt 391 to the bottom of the rollers 389, and a motor 393 drives the sheave 390A. The motor 393 rotates the endless belt 391 through the sheave 390A, causing each roller to rotate. The cord length carrier 320, which has been moved to and placed on the starting position of the third side 371C, can thus be transferred to the starting position of the fourth side 371D along the rollers 389 arranged, repeatedly.

Figure 17C:
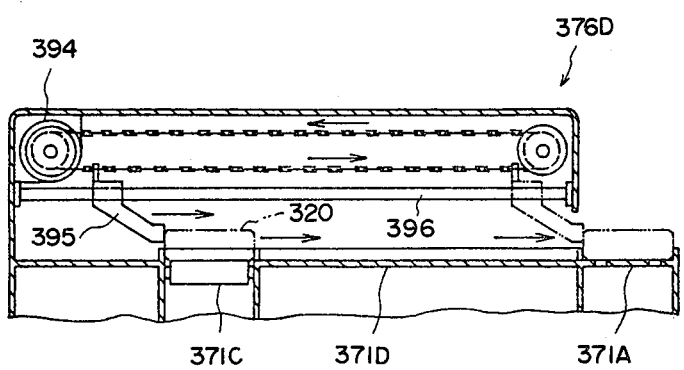
FIG. 17(c) is a view, partly in section, of the carrier moving means located at the fourth side of the rectangular circulating guide passage shown in FIG. 2(b), as viewed from the left side of FIG. 2(b)

The fourth side 371D, as seen in FIGS. 2(b) and 17(c), has a carrier moving means 376D which moves the cord length carrier 320 from the starting position of the fourth side 371D to the first position 372 of the first side 371A. This carrier moving means 376D comprises the same components as those of carrier moving means 376B of the second side 271B. That is, a motor 394 reciprocates a pushing member 395 along parallel guide rods 396, whereby the cord length carrier 320, which has been moved to and placed on the starting position of the fourth side 371D, is pushed toward the first position 372 of the first side 371A repeatedly.

The cord length carrier 320 with a plurality of cord lengths 1 having terminal blades, which has been transferred to and placed on the first position, is transferred to the second position 373 by means of the pushing member 378 of the carrier moving means 376A as described above. At this position, a casing of a plug, which accommodates therein portions of the cord and terminal blades connecting the end of a cord length to the base of each terminal blade, is formed by injection molding using a plug casing-forming molding machine 420.

Figure 1B:
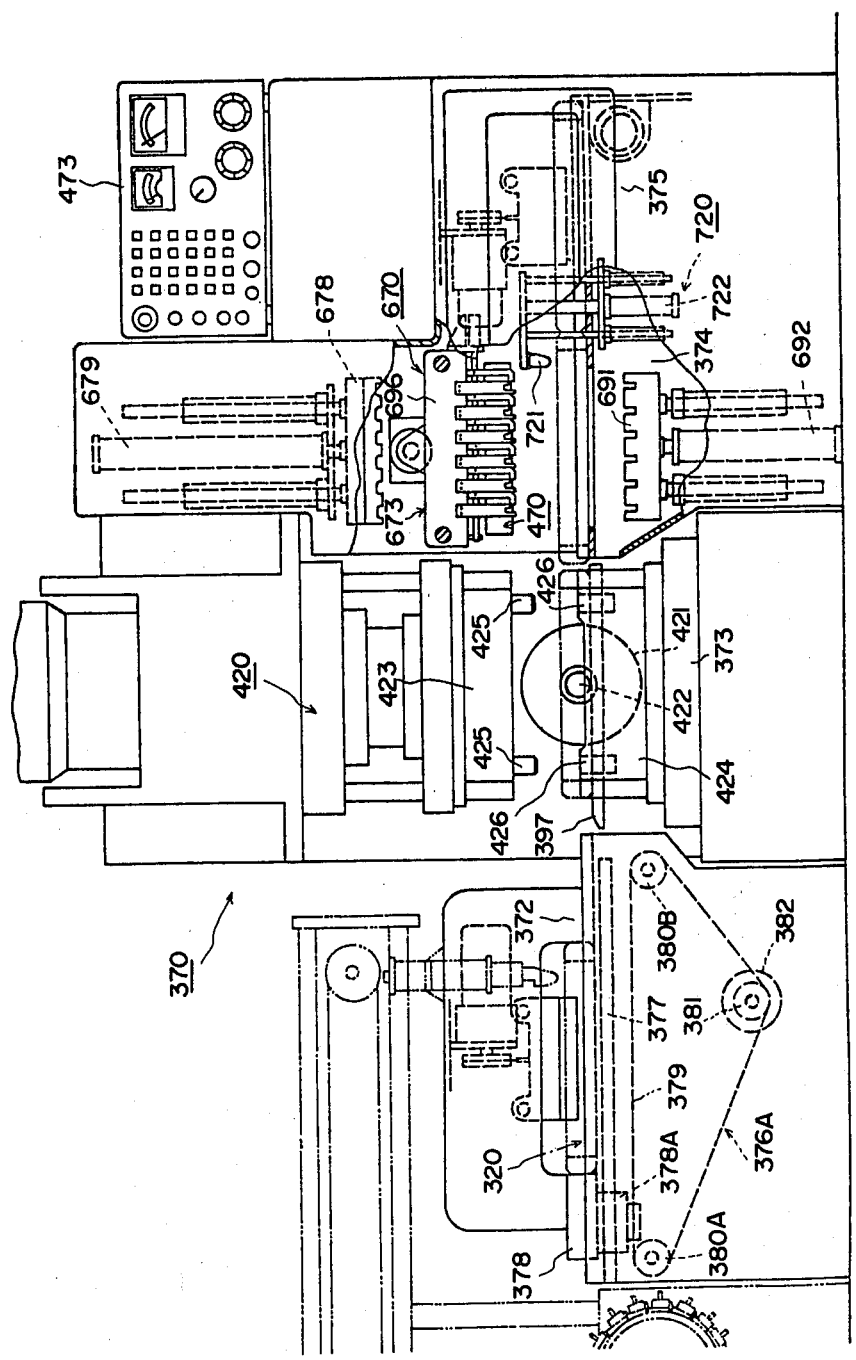
FIG. 1(b) is a side view of the latter half section of the automatic system for producing cord lengths with molded plugs constructed in accordance with the concepts of the invention.

The molding of the casings of the plugs is performed simultaneously with the cord lengths being arranged in the cord length carrier 320, at one time by means of the plug casing-forming molding machine 420. The plug casing-forming molding machine 420, as shown in FIGS. 1(b) and 2(b), includes injection molding equipment 421 for a thermoplastic resin and a cope 423 and a drag 424 which are provided in front of the injection nozzle 422 of the injection equipment 421. The cope 423 and the drag 424 are located just above and just below the second position 373 of the first side 371A, respectively. The second position 373 is provided with a pair of parallel rails 397 for guiding or loading thereon the cord length carrier 320. The cope 423 is usually retained in an elevated position where a cord length carrier 320 can come between the cope 423 and the drag 424. In such a plug casing-forming molding machine 420, when the cord length carrier 320 with cord lengths 1 are intermittently transferred to the second position 373 and set on the parallel rails 397 by means of the carrier moving means 376A, the parallel rails 397 are slightly lowered so that the cord length carrier 320 is fitted over the drag 424. Then the cope 423 is lowered so that the pilot rod 425 of the cope 423 is inserted into the pilot groove 426. As a result, the cord length carrier 320 is sandwiched tightly between the cope 423 and the drag 424. After this, a thermoplastic resin is fed into the plug cavities between the cope 423 and the drag 424 through the injection nozzle 422 of the injection equipment 421. As a result, as seen in FIG. 18, the plug casings are simultaneously molded into desired shapes, with each electric terminal 1 being arranged in the cord length carrier 320. Although such casing-forming molding machine 420 has no novelty in its construction, the novelty is in that a cope 423 and a drag 424 are provided respectively just above and just below the second position 373 of the first side 371A of the rectangular shaped circulating guide passage 371.

After the casings 427 of plugs have been molded and the cope 423 has been raised, the parallel rails 397 are slightly raised to their former position, causing the cord length carrier 320 to be released from the drag 424. Then the cord length carrier 320, having cord lengths 1 with plugs thereon, is intermittently transferred to the third position 374 provided with the electric performance inspecting apparatus 470 from said second position 373. It should be noted that the transferring of the cord length carrier 320 is carried out in such a manner that the succeeding cord length carrier 320 pushes the rear of the preceding cord length carrier 320.

In the present invention, a plurality of cord length carriers 320, four cord length carriers in this embodiment, are circulated along the rectangular shaped circulating guide passsage 371 so that the molding of the casings 427 of plugs may be performed efficiently. The circulation of the cord length carriers 320 is as follows:

As shown in FIG. 19(a), when cord length carriers 320 (represented by No. 1) are transferred to and placed on the second position 373 of the first side 371A and the cope 423 is lowered so that the molding of the casings 427 of plugs are performed, the cord length carrier 320 (represented by No. 2) which has been placed on the end position of the third side 371C is moved to the first position 372 of the first side 371A by means of the pushing member provided in the carrier moving means 376D, which is shown in FIG. 17(c). After the cope 423 has been lowered and the cord length carrier 320 (represented by No. 1) has been sandwiched tightly between the cope 423 and the drag 424, the cord length carrier 320 (represented by No. 3) which has been placed on the fourth position 375 of the first side 371A is transferred along the second side 371B by means of the pushing member 384 of the carrier moving means 376B (shown in FIG. 17(a)) and then transferred by means of the roller conveyor 376C (shown in FIG. 17(b)) along the third side 371C to the end position of the third side 371C where the cord length carrier 320 (represented by No. 2) was first positioned.

The resulting arrangement of four cord length carriers 320 is shown in FIG. 19(b). While the casings 427 of the plugs of the cord lengths which are loaded on the cord length carriers 320 (represented by No. 1) are being molded, the cord lengths 1 with molded plugs are automatically taken out from the cord length carrier 320 (represented by No. 4) which has been placed on the third position 374, followed by automatic electric performance inspection. As a result, the cord length carrier 320 (represented by No. 4) becomes empty. While the molding of the plug casing and the electric performance inspection are being performed, a plurality of the cord lengths 1 having terminal blades 175 are loaded on said cord length carrier 320 (represented by No. 2), which has been set in the first position 372 so that the cord lengths 1 having terminal blades 175 are ready to be molded. After the casings 427 of the plugs of the cord lengths 1 which had been set in the cord length carrier (represented by No. 1) have been molded and the cope 423 has been elevated, the cord length carrier 320 (represented by No. 2) having a plurality of cord lengths 1 is pushed toward the second position 373 by means of the pushing member 378 of the carrier moving means 376A. As a result, the cord length carrier 320 (represented by No. 1) having a plurality of cord lengths 1 with molded plugs is pushed toward the third position 374 by the cord length carrier 320 (represented by No. 2), causing the empty cord length carrier 320 (represented by No. 4) to transfer to the fourth position 375.

The resulting arrangement of the four cord length carriers 320 is shown in FIG. 19(c). The subsequent operations are the same. When the cope 423 is lowered onto the cord length carrier 320 (represented by No. 2), as shown in FIG. 19(d), the cord length carrier 320 (represented by No. 3) which has been placed on the end position of the third side 371C is transferred to the first position 371. After the cord length carrier 320 (represented by No. 2) has been sandwiched between the cope 423 and the drag 424, the cord length carrier 320 (represented by No. 4) which has been placed on the fourth position 375 is transferred to the end position of the third place 371C, where the cord length carrier 320 (represented by No. 3) was previously placed. After the molding of the plugs in the cord length carrier 320 (represented by No. 2) has been performed and the cope 423 has been elevated, the cord length carrier 320 (represented by No. 3) is pushed to the second position 373 by means of the pushing member 378. As a result, the arrangement of the four cord length carriers 320 is changed from the arrangement in FIG. 19(d) to the arrangement in FIG. 19(e), similarly to the change from the arrangement made in FIG. 19(b) to the arrangement in FIG. 19(c). That is, the cord length carrier 320 (represented by No. 1) and the cord length carrier 320 (represented by No. 2) are intermittently transferred to the fourth position 375 and the third position 374, respectively. In this way, the four cord length carriers 320 are circulated along the circulating guide passage 371 periodically.

After the molding of the casings of the plugs in the cord length carrier 320 has been performed, the cord length carrier 320 with the arranged cord lengths 1 having plugs, which is shown in FIG. 18, is transferred to the third position 374 as described above. At this position 374, a plurality of cord lengths 1 having molded plugs are taken out from the cord length carrier 320 and introduced into an electric performance inspecting apparatus 470 to check several electric characteristics of the plugs simultaneously and automatically. The automatic taking-out and shifting device 670 is provided for taking out the cord lengths 1 from the cord carrier 320, introducing the molded plugs which are attached to the cord lengths 1 into the electric performance inspecting apparatus 470, and pulling out the molded plugs from the electric performance inspecting apparatus 470 automatically. The automatic taking-out and shifting device 670, which is shown in FIGS. 20(a)-20(d) and 21(a)-21(d) is provided at the third position 374. The automatic taking-out and shifting device 670 comprises a plug hold-down means 671, a cord length holding-up and taking-out means 672, and a cord length suspending and pulling-out means 673. The plug hold-down means 671 includes a head 678. The head 678 comprises a base 677 and a metallic holding block 676 fixed thereto. The metallic holding block 676 is provided with recesses 675 which are to hold down the upper side of each of the plugs attached to a plurality of cord lengths 1. The head 678 is provided at the lower end of a moving rod 680 which is operated by a hydraulic cylinder 679, so that the head 678 is free to move up and down just above the cord length carrier 320 placed on the third position 374.

The cord length holding-up and taking-out means 672 includes an electrically insulated support plate 682, a metallic holding block 684, a metallic support plate 686, a cord length holding plate 689 and a head 691. The electrically insulated support plate is provided with a plurality of pairs of recesses 681 which are arranged for each pair of terminal blades of the plurality of cord lengths 1. The metallic holding block 684 is provided with recesses 683 which are to hold the lower half of each of the plugs attached to the cord lengths. The metallic support plate 686 is provided with recesses 685 by which the end part of each of the cord lengths 1 are to be held. The cord length holding plate 689 is provided with the same recesses 687 of those of metallic support plate 686. The head 691 comprises a base 690 on which the above-mentioned components are properly arranged. The head 691 is fixed on the upper end of a moving rod 693 which is movably fitted in a hydraulic cylinder 692. The head 691 is free to move up and down and cooperates with the head 678 of the plug hold-down means 671 to hold the inspection sample plug therebetween.

The cord length suspending and pulling-out means 673 includes two parallel guide rods 694A and 694B, a moving block 696, a plurality of cord length gripping plates 698, a plurality of hook plates 700 and an air cylinder unit 701. The two parallel guide rods 694A and 694B are horizontally provided above the electric performance inspecting apparatus 470 to cross the moving direction of the cord carrier 320 at right angle. The moving block 696 is provided on the parallel guide rods 694A and 694B to slide freely, and a space 695 through which the head 678 of said plug hold-down means 671 can move up and down is provided in the moving block 696. A plurality of the cord length gripping plates 698, each having a cord length engaging recess 697 at the lower end are fixedly attached in a row onto one lower side of the moving block 696, and extend downward. A plurality of hook plates 700 are fixedly attached in a row to a sliding rod 699, the rod 699 being provided at one lower side of the moving block 696 to slide freely, the hook plates 700 extending downward. The cord length engaging recesses 697 are opened and closed by means of the sliding movement of the hook plates 700 fixed to the sliding rods 699. The air cylinder unit 701 operates said sliding rod 699. The moving block 696 is reciprocated along the parallel guide rods 694A and 694B by means of a hydraulic cylinder 702, whereby the cord length gripping plates 698 and the hook plates 700 are horizontally moved close to the face of the electric performance inspecting apparatus 470, or horizontally moved away from the electric performance inspecting apparatus 470.

The electric performance inspecting apparatus 470 located at the third position 374 includes a plurality of a pair of downward opened notches 471, an electrically insulated base 472, and an electric characteristics indicating panel 473 (see FIG. 1). The plurality of a pair of downward opened notches 471 are provided just above the corresponding recesses 324 for terminal blades which are provided in the cord length carrier 320 placed on the third position 34. Further, the downward opened notches 471 are provided in a row on the electrically insulating base 472. The electric characteristic indicating panel 473 is electrically connected to each notch 471 through an electric conduit (not shown).

Figure 20C:
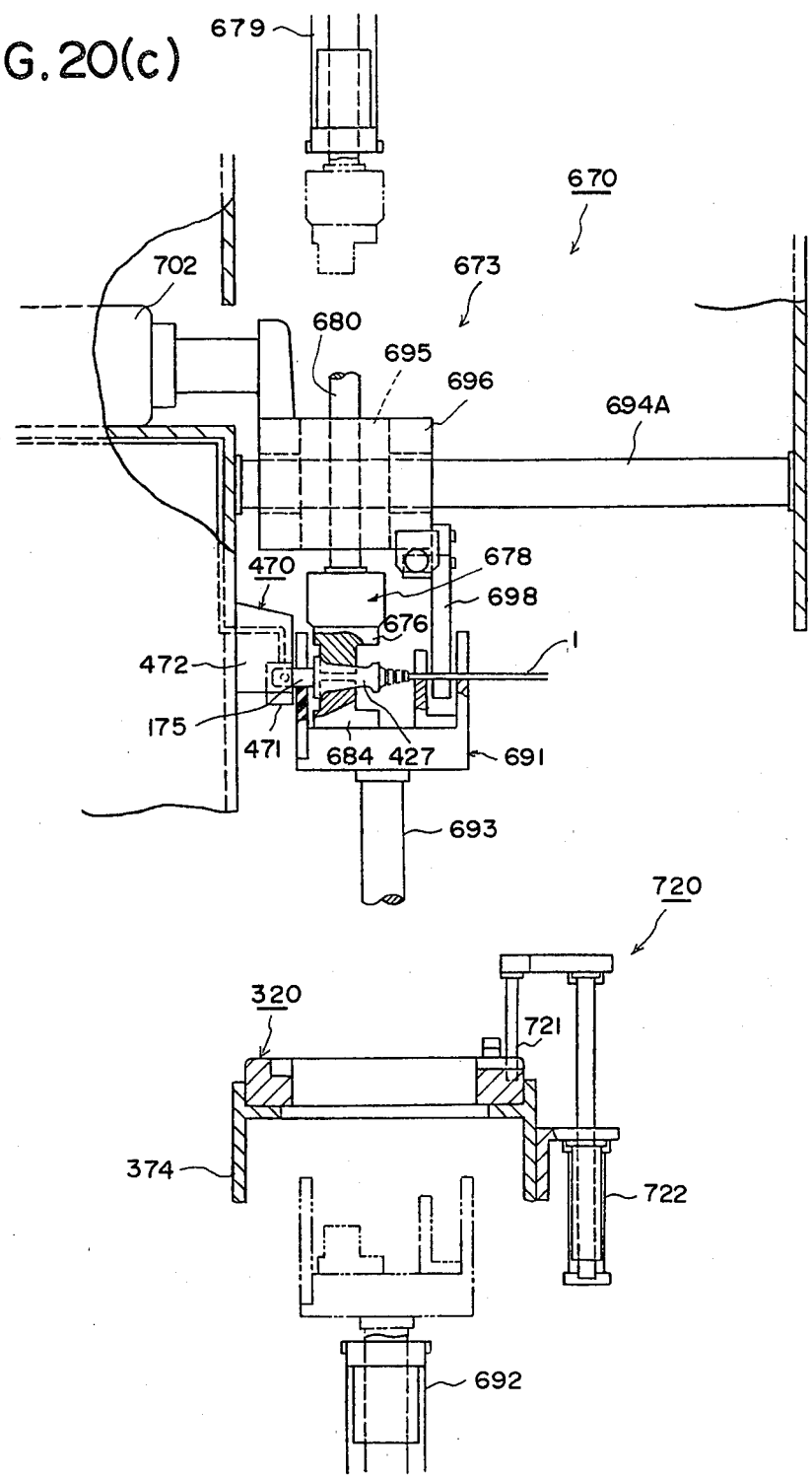
Figure 21B:
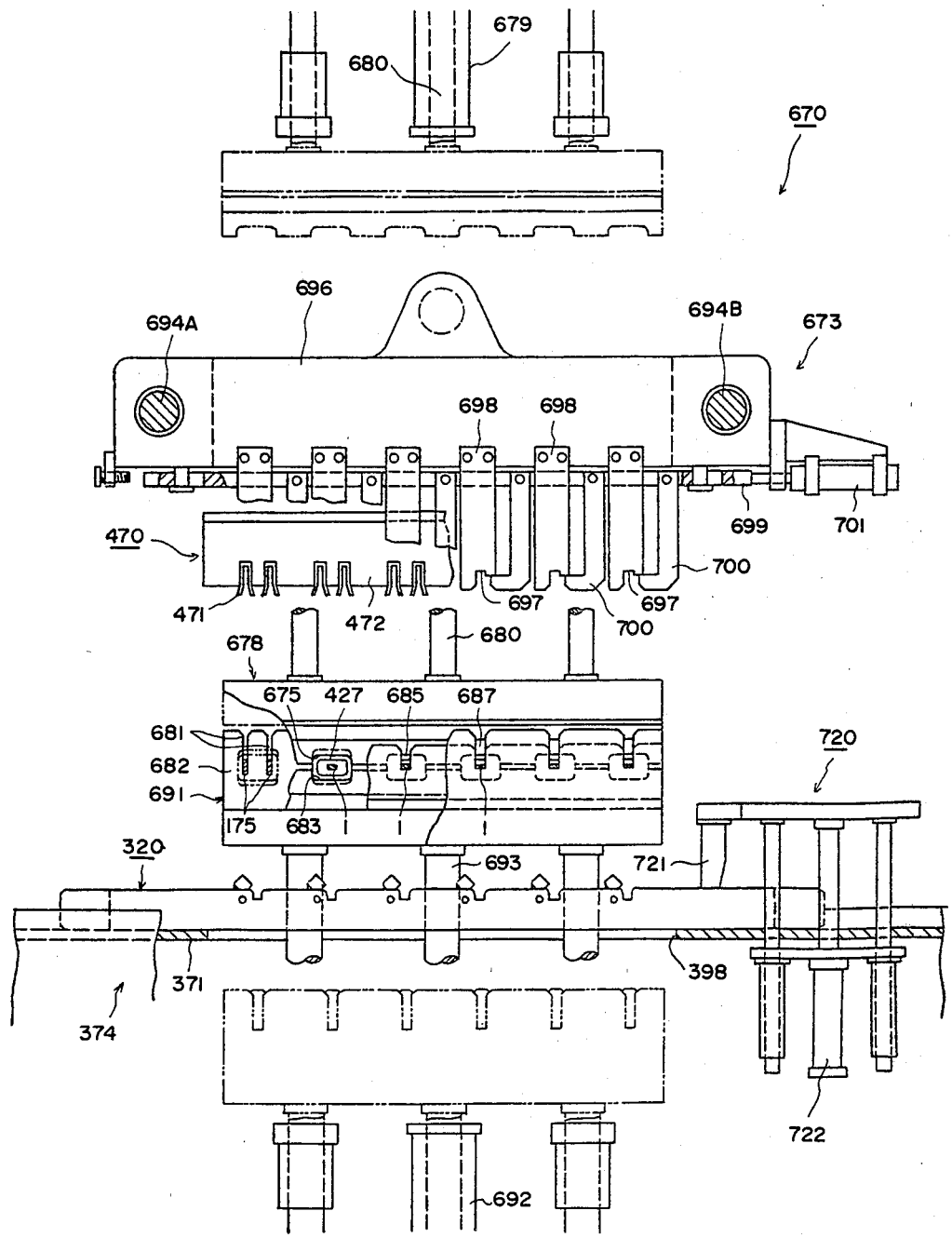
Figure 21C:
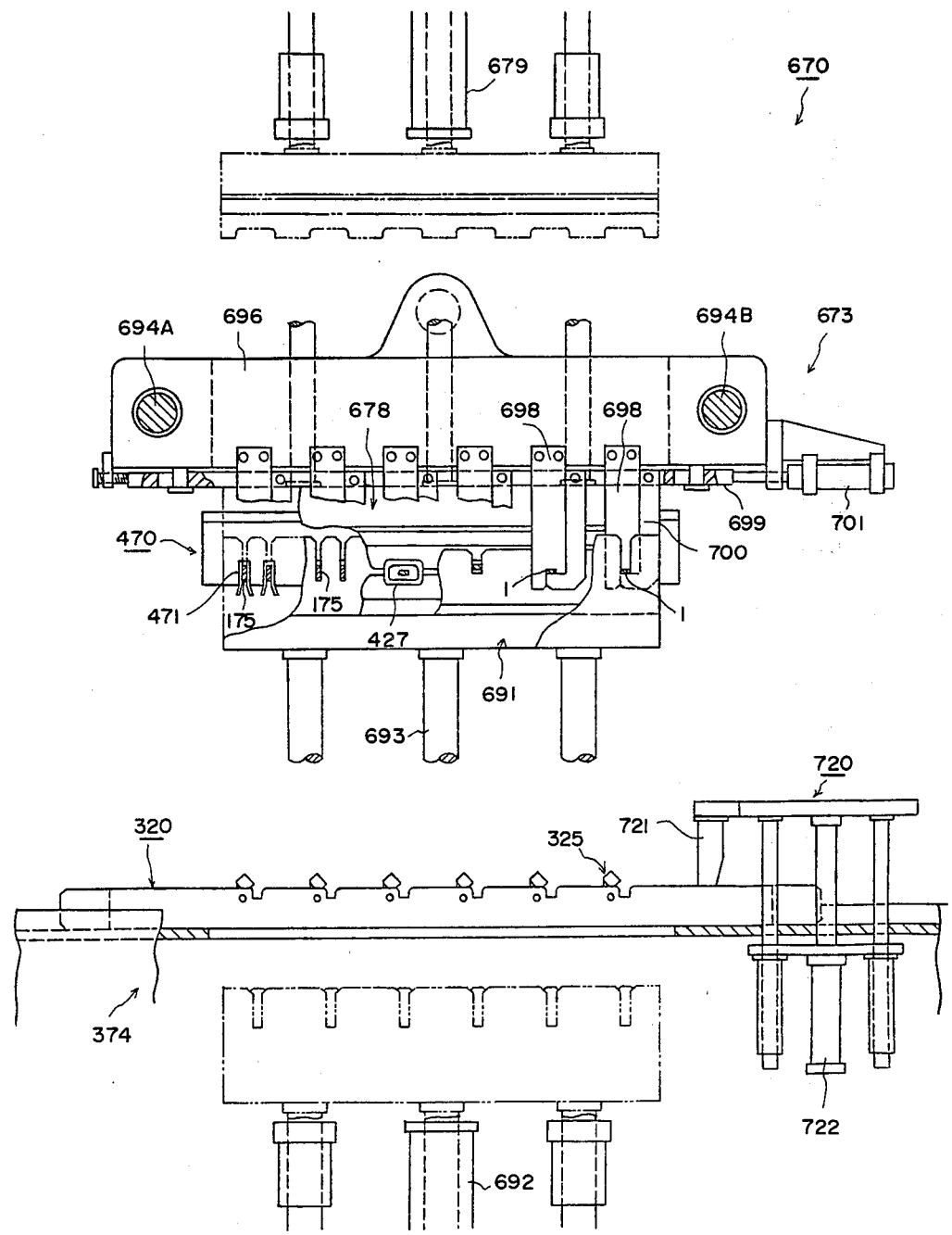

In taking out a plurality of cord lengths 1 with molded plugs from the cord length carrier 320 placed on the third position 374, first, as shown in FIG. 21(a), the cord chucks 325 of the cord length carrier 320 are simultaneously opened by means of a cord chuck operating means 720 similar to the cord chuck operating means 620 provided at the first position 372 prior to the operation of the automatic taking-out and shifting device 670. That is, the pushing rod 721 of the cord chuck operating means 720 is lowered to be inserted into the opening 333 by means of an air cylinder unit 722, so that the cord chucks 325 are opened automatically. After this operation, as shown in FIGS. 20(a) and 21(a) by two-dot chain lines, the head 678 of the plug hold-down means 671 is lowered toward the cord length carrier 320. When the metallic holding block 676 reaches the position just above the casings of the plugs, the head 678 of the plug hold-down means 671 stops. Then the head 691 of the cord length holding-up and taking-out means 672 is elevated through the space 398 of the third position 374 of the circulating guide passage 371 and the space 322 of the cord length carrier 320 placed thereon. As a result, the terminal blade 175 of each of the plugs is inserted in each recess 681 of the electrically insulating material-made support plate 682. At the same time, the lower surface of each of the casings 427 of the plugs is held by each recess 683 of the metallic holding block 684, and the parts near the end part of each cord length 1 are inserted into each recess 685 of the metallic support plate 686 and into each recess 687 of the cord length holding plate 689. When the head 691 of the cord length holding-up and taking-out means 672 is further elevated, a plurality of molded plugs of the cord lengths 1, which are arranged in a row, are simultaneously taken out upwardly. Further, the head 691 of the cord length holding-up and taking-out means 672 is elevated so that, as shown in FIGS. 20(b) and 21(b), the casing 427 of each of the plugs is sandwiched between each recess 675 of the metallic holding block 676 of the lowered head 678 and each recess 683 of the metallic holding block 684 of the head 691. The plugs of cord lengths 1 which are sandwiched between both the metallic holding blocks 676 and 684 are then elevated so that, as shown in FIGS. 20(c) and 21(c), each terminal blade 175 of the cord lengths 1 is simultaneously inserted into corresponding notches 471 of the electric performance inspecting apparatus 470.

At the same time, the part near the end part of each cord length 1 will enter each cord length gripping recess 697 of the cord gripping plates 698. As soon as the part near the end part of each cord length 1 enters each cord gripping recess 697, each hook plate 700 is slid by means of the air cylinder unit 701 so that each cord gripping recess 697 is closed by each hook plate 700 and the cord lengths 1, which are arranged in a row, are suspended. At this condition, the electric characteristics of the molded plugs are inspected by means of the electric performance inspecting apparatus 470. After the inspection of the electric characteristics of the plugs, as shown in FIGS. 20(d) and 21(d), the head 678 of the plug hold-down means 671 is elevated and the head 691 of the cord length holding-up and taking-out means 672 is lowered to return to the original position. Further, the moving block 696 is moved away from the electrically insulating base 472 along the parallel guide rods 694A and 694B by means of the hydraulic cylinder 702, whereby each terminal blade 175 is simultaneously pulled out from each notch 471. The resulting situation is shown in FIG. 20(d) by a two-dot chain line.

After these operations, the hook plates 700 are slid by means of the air cylinder unit 701 to open the cord length engaging recess 697 of each cord gripping plate 698, so that a plurality of the cord lengths 1 with molded plugs which have been inspected are released to the outside of the system. It should be noted that the inspection of a plurality of the plugs attached to the cord lengths 1 is performed with respect to electric characteristics automatically and, after inspection, the good plugs can be separated from the bad.

Each plug of each cord length 1 is inspected with respect to the following four items: (1) continuity test for checking the electric connection between each terminal blade 175 and a conductor; (2) insulation test for checking if one of the pair of the terminal blades 175 enclosed in a molded casing is insulated from the other terminal blades; (3) withstand voltage test to ground for checking to see if a current more than an allowable current does not flow from a terminal blade to ground through a molded housing when a predetermined voltage is applied to the terminal blade; and (4) withstand voltage test with respect to the pair of terminal blades enclosed in a molded housing. These four tests are automatically performed by means of the electric test apparatus 470 successively. The results of the tests are indicated in the panel 473 with respect to each plug of cord length 1.

In respect of the cord carrier 320 from which cord lengths 1 have been taken out, the cord chucks 325 thereof are closed since the pushing rod 721 of the cord chuck operating apparatus 720 is automatically elevated. After this, as described above, the cord carrier 320 is pushed toward the fourth position 375 by a succeeding cord carrier 320. Then the pushed cord carrier 320 is carried back to the first position through the second side 371B, the third side 371C, and the fourth side 371D of the circulating guide passage 371.

As described in the above example, drawing out a cord 1, cutting the cord 1 into a predetermined length, transferring the cord lengths 1, applying terminal elements 175 to the cord lengths 1, molding the casings 427 of plugs, and checking the molded plugs with respect to electric characteristics are performed efficiently, successively and automatically.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims rather than the foregoing description, and all changes which come within the meaning and range of the equivalency of the claims are, therefore, to be embraced therein.

What is claimed is:

1. An apparatus for performing an operation on a plurality of electric cords with a pair of terminal blades attached to each cord, said apparatus comprising:

(a) a plurality of carriers for receiving a plurality of electric cords with a pair of terminal blades attached to each cord, each of said carriers comprising a frame member having first and second sides opposed to each other, and said first side having a plurality of pairs of recesses therein, each of said pair of recesses for receiving a pair of said terminal blades and first securing means for securing said terminal blades in said recesses, and said second side having a plurality of cord inserting grooves, each of said grooves for receiving one of said cords therein and cord chuck means for retaining said cords in said grooves, wherein said cord chuck means are automatically operated;

(b) a first side conveyor means having a first position thereon for loading said carriers with said plurality of electric cords with said terminal blades, a second position for placing said plurality of electric cords with said terminal blades into an injection molding device for forming a casing around the end portion of each said cord and said terminal blades, a third position for removing said cord and terminal blades in said casing from said carrier and for placing said cord and terminal blades in said casing into an electric inspection apparatus, and a fourth position for receiving said empty carrier;

(c) a second side conveyor means having a first position at one end thereof coinciding with the fourth position of said first side conveyor means and a second position at the other end thereof, said second side conveyor means transferring said empty carrier from said first position thereof to the second position thereof;

(d) a third side conveyor means having a first position at one end thereof coinciding with the second position of said second side conveyor means and a second position at the other end thereof, said third side conveyor means transferring said empty carrier from the first position thereof to the second position thereof; and (e) a fourth side conveyor means having a first position at one end thereof coinciding with the second position of said third side conveyor means and a second position at the other end thereof coinciding with the first position of said first side conveyor means, said fourth side conveyor means transferring said empty carrier from said first position thereof to the second position thereof for reloading said carrier with an additional plurality of electric cords with a pair of terminal blades, wherein said first, second, third and fourth side conveyor means are driven independently and are positioned with respect to one another to form a rectangle.

2. An apparatus set forth in claim 1 wherein said electric cords are positioned in said carrier such that they are aligned perpendicular to the axis passing through the first, second, third and fourth positions of said first side conveyor means.

3. An apparatus as set forth in any one of claims 1 or 2, wherein said electrical inspection apparatus simultaneously tests a plurality of electrical plugs including said casing, said pair of terminal blades extending from one side of said casing and said electric cord extending from the other end of said casing, said electrical inspection apparatus comprising:

(a) a plurality of cord engaging means, each having a first electrically insulated support plate for supporting said pair of terminal blades, an electrically conducting holding block for supporting said casing, a second support plate for supporting said cord and means for moving said plurality of cord engaging means to simultaneously engage said plurality of electrical plugs on one side thereof;

(b) a plurality of electrically conducting plug hold-down means aligned with said plurality of cord engaging means for contacting said casing on the opposite side thereof from said holding block, said plug hold-down means including means for moving said hold-down means towards and away from said electrical plug wherein, upon the movement of said engaging means and said plug hold-down means towards each other, said electrical plug is held therebetween; and (c) inspection means for simultaneously receiving said plurality of electrical plugs wherein said cord engaging means and said plug hold-down means are aligned with said inspection means and are moved by the moving means thereof for removing said plug from said carrier and placing said electrical plugs into said inspection means.

4. An apparatus as set forth in claim 3 including a plurality of cord pulling-out means, each said cord pulling-out means engaging one of said cords when said electrical plugs are in said inspection means, each of said cord pulling-out means including moving means for moving said cord pulling-out means in a direction for pulling said electrical plugs from said inspection means.

5. An apparatus as set forth in claim 4, wherein each of said cord pulling-out means includes a gripping plate having an engaging recess therein, a hook plate having a hook portion thereof, said hook plate being slidable with respect to said gripping plate and moving means for sliding said hook plate relative to said gripping plate wherein when said hook plate is slid in a first direction, said engaging recess of said gripping plate is opened, thereby permitting the receiving of an electrical cord therein and wherein, when said hook plate is slid in a second direction, said engaging recess is closed, thereby gripping said electrical cord therein.

6. An apparatus as set forth in claim 1, wherein first securing means comprises a pair of ball members, each of said ball members extending into one of said recesses and first spring means positioned between said ball members for biasing said ball members towards said recesses.

7. An apparatus as set forth in claim 1 or 6, wherein said cord chuck means comprises a cord holding member pivotally mounted to said frame member, said cord holding member having a covering portion for covering at least a portion of said cord inserting grooves; and a second spring means for biasing said covering member about its pivotal mounting such that said covering portion covers at least a portion of said cord inserting grooves.

8. An apparatus as set forth in claim 7 including operating means for automatically operating said cord chuck means, said operating means comprising sliding rod means positioned in said carrier means, and pusher means for engaging said sliding rod means and pushing said sliding rod means in a first direction, wherein said cord holding member includes an engaging portion for engaging said sliding rod means, wherein when said pusher means pushes said sliding rod means in said first direction, said engaging portion is rotated about said pivotal mounting, thereby rotating said covering portion such that said inserting grooves are uncovered, thereby permitting the insertion or withdrawal of a cord therefrom, and wherein when said pusher means disengages from said sliding rod means, said sliding rod means is slid in an opposite direction by said engaging portions, said engaging portions being rotated about the pivotal mounting by said second spring means and thereby rotating said covering portion such that said inserting grooves are covered.

9. An apparatus as set forth in claim 8 including transfer means for transferring said plurality of cords to said carrier, wherein said transfer means is positioned to transfer said plurality of cords, wherein said pusher means engages said sliding rod means, thereby uncovering said inserting grooves for permitting said cords to be inserted therein.

10. An electrical inspection apparatus for simultaneously testing a plurality of electrical plugs having a casing, a pair of terminal blades extending from one side thereof and an electric cord extending from the other end thereof, said apparatus comprising:

(a) a plurality of cord engaging means, each having a first electrically insulated support plate for supporting said pair of terminal blades, an electrically conducting holding block for supporting said casing and a second support plate for supporting said cord and means for moving said plurality of cord engaging means to simultaneously engage said plurality of electrical plugs on one side thereof;

(b) a plurality of electrically conducting plug hold-down means aligned with said plurality of cord engaging means for contacting said casing on the opposite side thereof from said holding block, said plug hold-down means including means for moving said hold-down means towards and away from said electrical plug wherein, upon the movement of said engaging means and said plug hold-down means towards each other, said electrical plug is held therebetween; and (c) inspection means for simultaneously receiving said plurality of electrical plugs wherein said cord engaging means and said plug hold-down means are aligned with said inspection means and are moved by the moving means thereof for placing said electrical plugs into said inspection means.

11. An apparatus as set forth in claim 10 including a plurality of cord pulling-out means, each said cord pulling-out means engaging one of said cords when said electrical plugs are in said inspection means, each of said cord pulling-out means including moving means for moving said cord pulling-out means in a direction for pulling said electrical plugs from said inspection means.

12. An apparatus as set forth in claim 11, wherein each of said cord pulling-out means includes a gripping plate having an engaging recess therein, a hook plate having a hook portion thereof, said hook plate being slidable with respect to said gripping plate and moving means for sliding said hook plate relative to said gripping plate wherein when said hook plate is slid in a first direction said engaging recess of said gripping plate is opened, thereby permitting the receiving of an electrical cord therein and wherein, when said hook plate is slid in a second direction, said engaging recess is closed, thereby gripping said electrical cord therein.

* * * * *